United States Patent
Sounart et al.

(10) Patent No.: US 11,756,948 B2
(45) Date of Patent: Sep. 12, 2023

(54) IN SITU PACKAGE INTEGRATED THIN FILM CAPACITORS FOR POWER DELIVERY

(71) Applicant: Intel Corporation, Santa Clara, CA (US)

(72) Inventors: Thomas Sounart, Chandler, AZ (US); Aleksandar Aleksov, Chandler, AZ (US); Henning Braunisch, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 981 days.

(21) Appl. No.: 16/400,768

(22) Filed: May 1, 2019

(65) Prior Publication Data
US 2020/0350303 A1    Nov. 5, 2020

(51) Int. Cl.
*H01L 27/01* (2006.01)
*H01L 21/47* (2006.01)
*H01L 23/522* (2006.01)
*H01L 49/02* (2006.01)

(52) U.S. Cl.
CPC ............ *H01L 27/016* (2013.01); *H01L 21/47* (2013.01); *H01L 23/5223* (2013.01); *H01L 23/5226* (2013.01); *H01L 28/75* (2013.01)

(58) Field of Classification Search
CPC ............... H01L 27/016; H01L 23/5223; H01L 23/5226; H01L 28/75
See application file for complete search history.

(56) References Cited

U.S. PATENT DOCUMENTS 11,581,271 B2 *  2/2023  Jain ...................... H01L 23/642
2002/0102768 A1  8/2002  Shioga
2007/0141800 A1  6/2007  Kurihara
(Continued)

FOREIGN PATENT DOCUMENTS

| CN | 107622950 | | 1/2018 | |
|----|-----------|---|--------|---|
| EP | 3734656 A1 | * | 11/2020 | ............. H01L 21/47 |
| WO | WO-2018122995 A1 | * | 7/2018 | ........... H01L 21/822 |

OTHER PUBLICATIONS

Search Report from European Patent Application No. 20162885.6, dated Aug. 25, 2020, 8 pgs.

*Primary Examiner* — Joseph C. Nicely
(74) *Attorney, Agent, or Firm* — Schwabe, Williamson & Wyatt, P.C.

(57) ABSTRACT

Embodiments described herein are directed to a thin film capacitor (TFC) for power delivery that is in situ in a package substrate and techniques of fabricating the TFC. In one example, the TFC includes a first electrode, a dielectric layer over the first electrode, and a second electrode over the dielectric layer. Each of the dielectric layer and the second electrode comprises an opening. Furthermore, the two openings are positioned over one another such that the openings expose a surface of the first electrode. In this example, a first vertical interconnect access (via) is positioned on the exposed surface of the first electrode and a second via is positioned on an exposed surface of the second electrode. The TFC can be positioned in or on a layer of the package substrate close to a component (e.g., a die, a die stack, etc.) on the package substrate that may require a decoupling capacitance.

28 Claims, 21 Drawing Sheets

(56) References Cited

U.S. PATENT DOCUMENTS

| | | | |
|---|---|---|---|
| 2008/0003765 A1* | 1/2008 | Seh | H05K 1/162 |
| | | | 438/396 |
| 2008/0153245 A1* | 6/2008 | Lin | H01L 23/5223 |
| | | | 257/E21.003 |
| 2012/0261832 A1* | 10/2012 | Takano | H01L 23/49822 |
| | | | 257/E21.597 |
| 2014/0103489 A1* | 4/2014 | Dirnecker | H01L 27/016 |
| | | | 257/532 |
| 2019/0305074 A1* | 10/2019 | Kande | H01L 21/0332 |
| 2020/0006258 A1* | 1/2020 | Aleksov | H01L 24/16 |
| 2020/0066622 A1* | 2/2020 | Jain | H01G 4/228 |
| 2020/0194393 A1* | 6/2020 | Wu | H01L 24/09 |
| 2020/0219861 A1* | 7/2020 | Kamgaing | H03H 9/0561 |
| 2020/0294964 A1* | 9/2020 | Min | H01L 23/295 |
| 2022/0320227 A1* | 10/2022 | Gao | G09G 3/3241 |

* cited by examiner

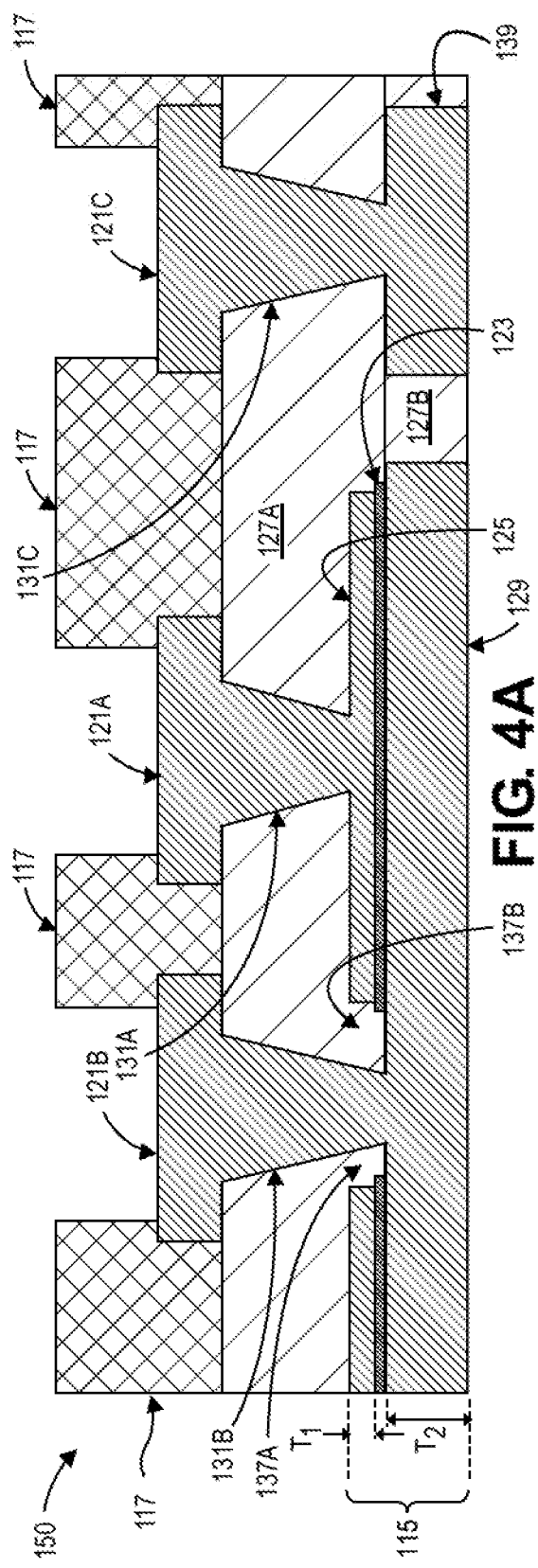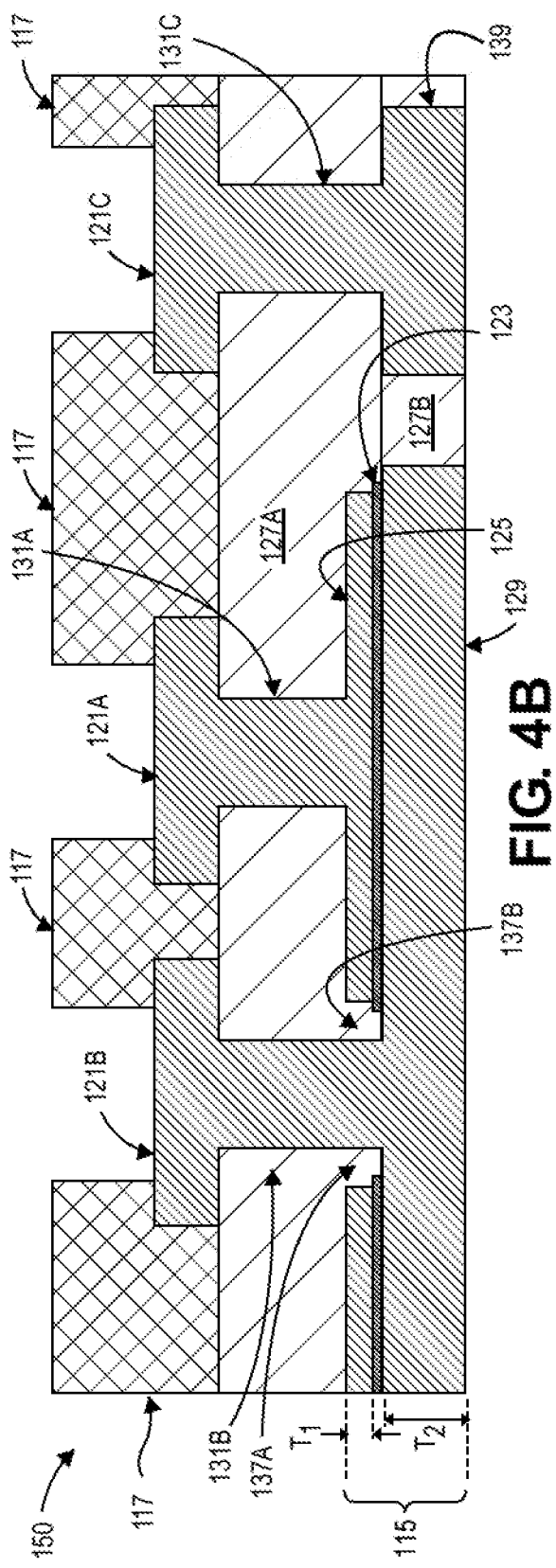

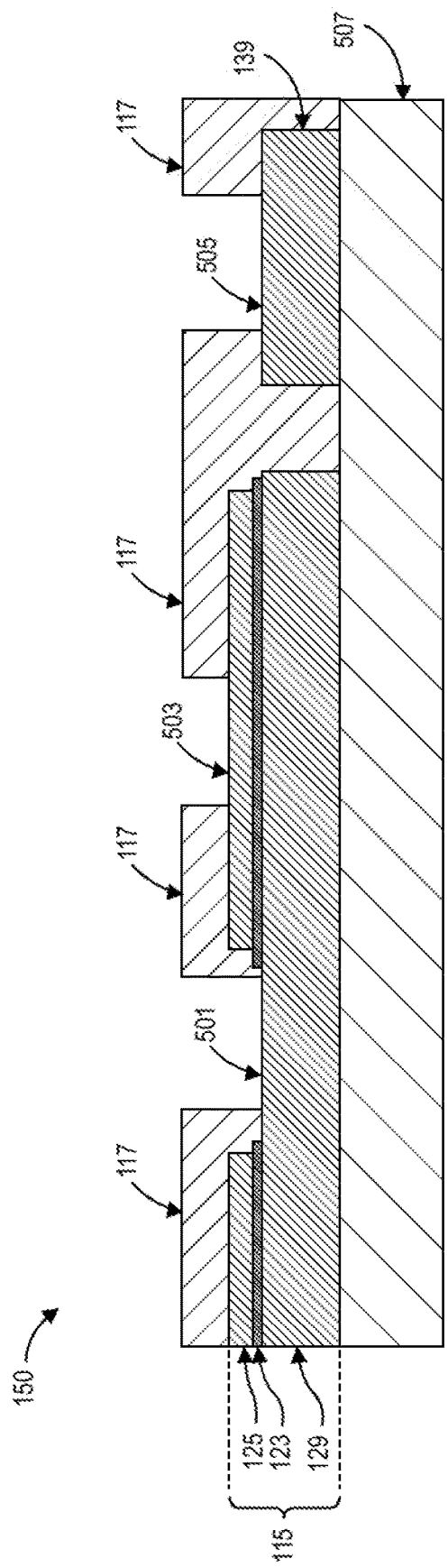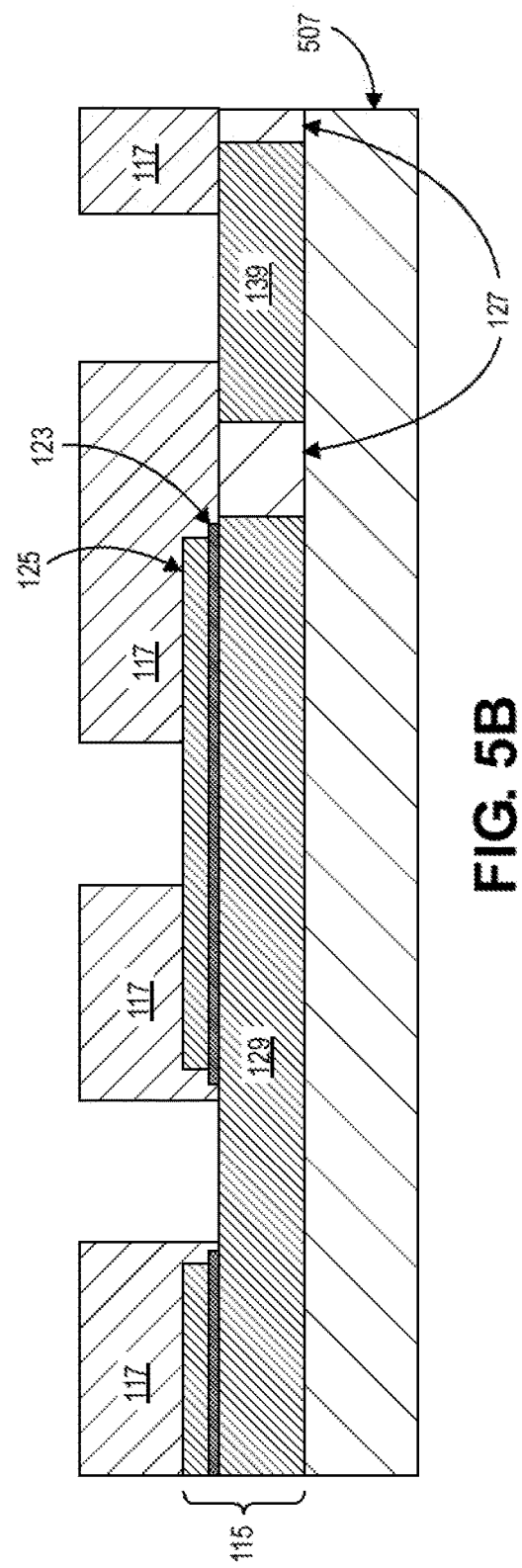

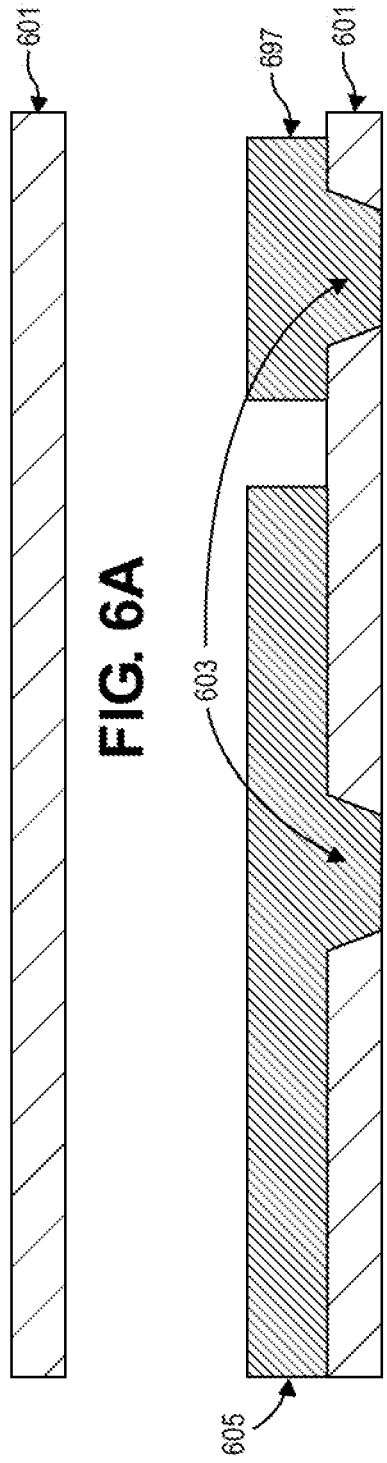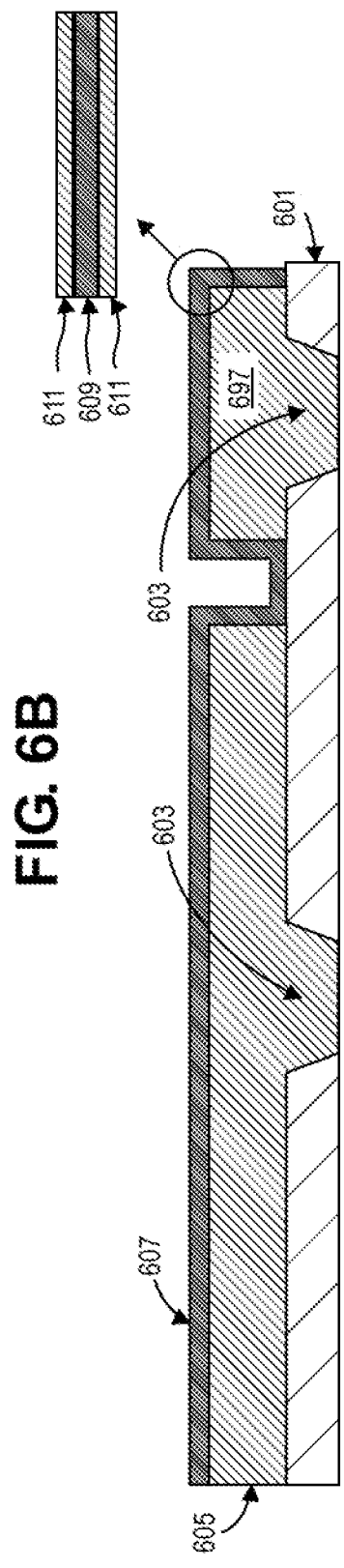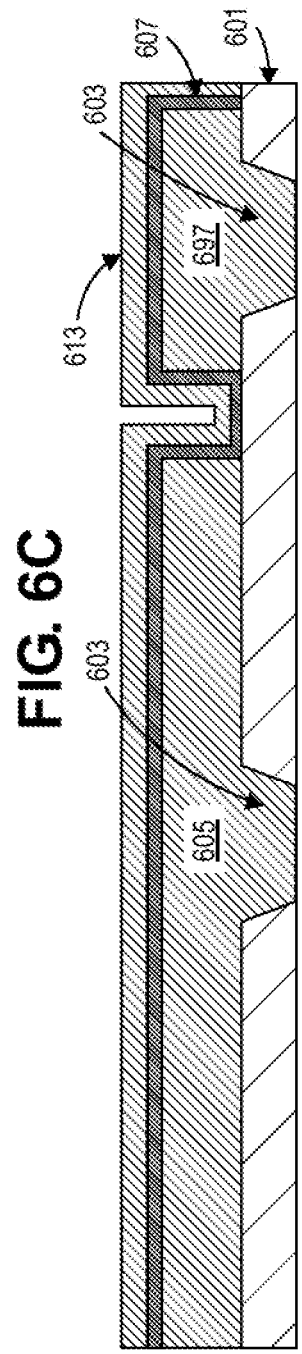

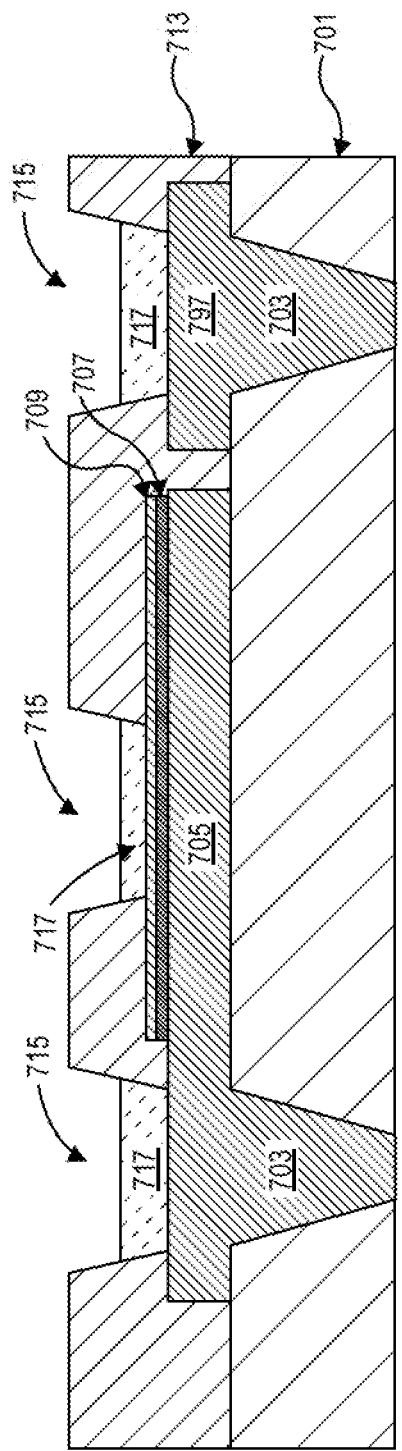
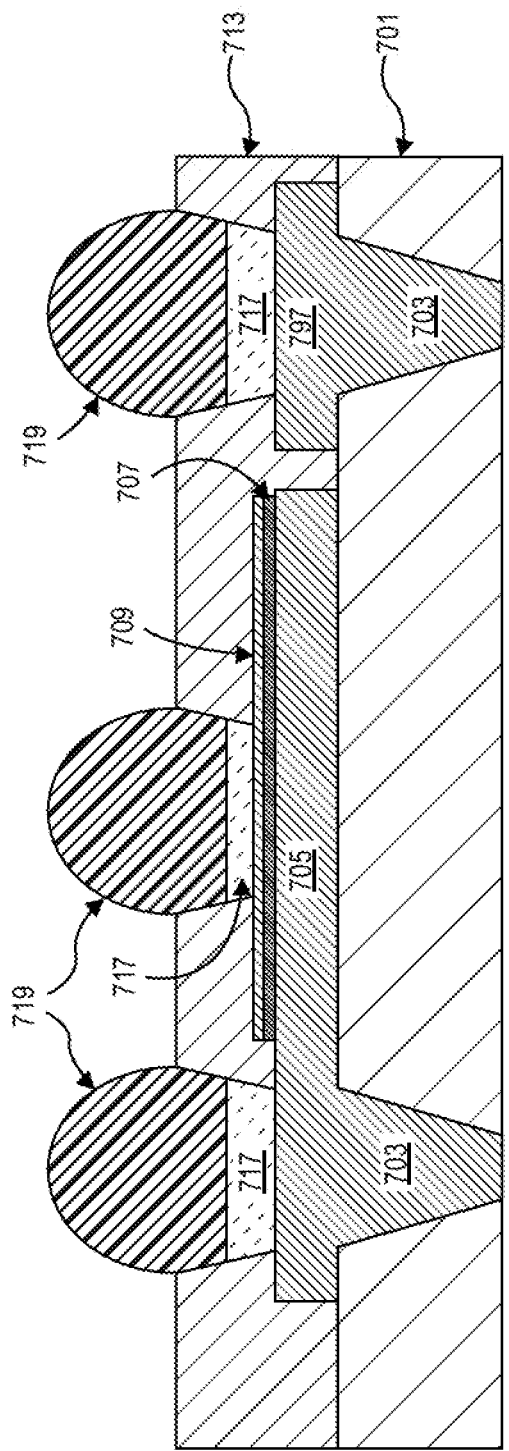

IN SITU PACKAGE INTEGRATED THIN FILM CAPACITORS FOR POWER DELIVERY

BACKGROUND

Field

Embodiments described herein generally relate to semiconductor packages. More particularly, but not exclusively, embodiments described herein relate to an in situ thin film capacitor (TFC) that is fabricated in or on an electronic package (e.g., a package substrate of a semiconductor package, etc.).

BACKGROUND INFORMATION

Decoupling capacitors are used to supply current to processor die during transient spikes in power demand and to minimize power supply noise. Power delivery requirements for server processors and other advanced processing platforms include an increasing demand for more decoupling capacitance close to the die to prevent excessive voltage droop on voltage rails such as $V_{CC,IN}$ and $V_{CC,OUT}$. This capacitance cannot be supplied by landside or die side multilayer ceramic capacitors (MLCCs) because of the high-inductance path and packaging of these discrete surface mounted components. Furthermore, the additional on-die metal-insulator-metal (MIM) capacitance that would be required to meet this demand is excessively high and is not effective at high frequencies due to high equivalent series resistance (ESR). One solution for providing the needed decoupling capacitance is to integrate a capacitive layer into the package substrate below the die. Ex situ fabricated decoupling thin film capacitor (TFC) sheets can be purchased and embedded into the package substrate by pick-and-place techniques at the die-level. However, using ex situ fabricated decoupling TFC sheets is costly and limits design flexibility.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIG. 4A is a cross-sectional side view illustration of an electronic package portion that comprises a TFC and laser drilled vias, according to one embodiment.

FIG. 4B is a cross-sectional side view illustration of an electronic package portion that comprises a TFC and lithographic vias, according to one embodiment.

FIG. 5A is a cross-sectional side view illustration of the electronic package portion that includes a TFC on a topmost layer of the package substrate, according to one embodiment.

FIG. 5B is a cross-sectional side view illustration of the electronic package portion that includes a TFC on a topmost layer of the package substrate, according to another embodiment.

FIGS. 6A-6G are cross-sectional side view illustrations of a process of fabricating a TFC in an electronic package, according to one embodiment.

FIGS. 7A-7I are cross-sectional side view illustrations of a process of fabricating a TFC in an electronic package, according to another embodiment.

DETAILED DESCRIPTION

Figure 1:
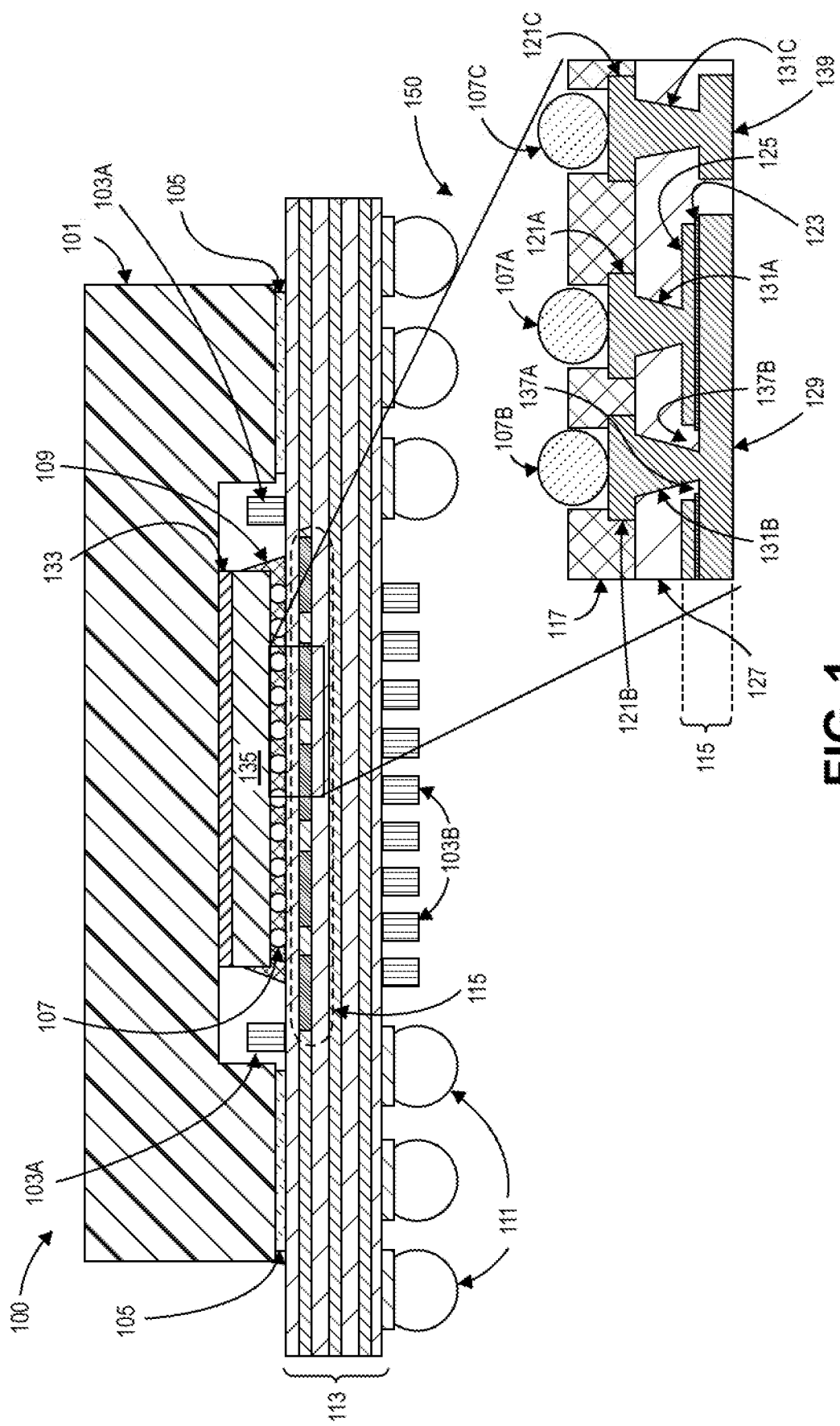
FIG. 1 is a cross-sectional side view illustration of a semiconductor package that includes an in situ thin film capacitor (TFC) in a portion of an electronic package, according to one embodiment.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein are directed to a thin film capacitor (TFC) in an electronic package and techniques of fabricating such a TFC in situ with the electronic package. Such a TFC may sometimes be referred to as an in situ TFC herein. Embodiments of the in situ TFC described herein are fabricated in an electronic package, unlike an ex situ TFC that is fabricated independently of the electronic package.

Several advantages accrue from the embodiments of the in situ TFC described herein and from the described techniques of forming the in situ TFC. Given that the in situ TFC is formed as part of an electronic package, the in situ TFC can be placed anywhere in the electronic package, which in turn means that the in situ TFC can be placed closer to one or more components (e.g., dies, etc.) in or on a package substrate than an MLCC. In this way, the in situ TFC can provide a decoupling capacitance to the component(s) that has an improved response when compared to the response of the decoupling capacitance provided by an MLCC. Additionally, fabricating an in situ TFC does not require any additional processing operations (e.g., picking and placing, etc.). Instead, the in situ TFC may be fabricated using processing operations typical of electronics packaging fabrication. As a result, fabricating an in situ TFC does not significantly increase costs associated with semiconductor packaging and manufacturing when compared to the costs associated with including an ex situ TFC in a package substrate. Also the in situ package TFC obviates the need for additional on-die MIM and is more effective at higher frequencies due to lower ESR.

FIG. 1 is a cross-sectional side view illustration of a semiconductor package 100 that includes an in situ thin film capacitor (TFC) 115 in a portion 150 of an electronic package (referred to herein as an "electronic package portion 150"), according to one embodiment. FIG. 1 also provides a zoomed-in illustration of the electronic package portion 150 in order to more clearly illustrate aspects of certain embodiments disclosed herein.

In an embodiment, the semiconductor package 100 comprises a package substrate 113. The package substrate 113 may comprise alternating layers of dielectric material (e.g., build-up layers) and metal layers, as is known in the art. A solder resist layer may be positioned on a topmost or a bottommost layer of the package substrate 113, as is known in the art. Furthermore, the package substrate 113 may be a cored or coreless package substrate. In an embodiment, the electronic package portion 150 may be integrated as part of the package substrate 113. In an embodiment, a component 135 (e.g., a die, a die stack, or the like) may be electrically coupled to the package substrate 113. For example, the component 135 may be electrically coupled to the package substrate 113 with interconnects 107. An underfill 109 may encapsulate the interconnects 107. The semiconductor package 100 may also include interconnects 111 formed on a bottom side of the package substrate 113. The interconnects 111 may be bumps, pillars, etc. The interconnects 111 may be formed from solder, copper, lead, any other suitable metal or alloy, or any combination thereof.

In one embodiment, the semiconductor package 100 includes one or more die side multilayer ceramic capacitors (MLCCs) 103A or one or more landside MLCCs 103B to provide capacitance to the component 135. As shown, the die side MLCCs 103A are adjacent to a heat spreader 101 and the component 135, while the landside MLCCs 103B are positioned on a bottom side of the package substrate 113. In one embodiment, the package 100 may also include one or more on-die metal-insulator-metal (MIM) capacitors (not shown) in the component 135 to provide capacitance to the component 135.

The semiconductor package 100 may also include a heat spreader 101, whose primary function is spreading thermal energy from the component 135 to a larger area (e.g., a heat sink (not shown), etc.). As shown in FIG. 1, the heat spreader 101 is coupled to the package substrate 113 and the component 135 using an adhesive 105 and a thermal interface material 133, respectively.

In order to improve the performance of the semiconductor package 100, at least one in situ TFC 115 (which may be referred to herein as simply "TFC 115" for brevity) is positioned in the package substrate 113. The TFC 115 can provide a decoupling capacitance for the semiconductor package 100. For example, the TFC 115 can provide a decoupling capacitance to the component 135. In one embodiment, the TFC 115 is formed as part of the package substrate 113. That is, and for this embodiment, the TFC 115 is formed using the manufacturing operations and processes to form the package substrate 113. Furthermore, the TFC 115 can be positioned anywhere in the package substrate 113. Furthermore, the TFC 115 can be positioned in the package substrate 113 to span an area of the package substrate 113 under the component 135. In one embodiment, the TFC 115 is placed in or on a layer of the package substrate 113 under the component 135 such that an area (e.g., in the x-y plane) of the TFC 115 at least partially overlaps an area (e.g., in the x-y plane) of the component 135. Stated differently, a footprint of the TFC 115 at least partially overlaps a footprint of the component 135. For example, a footprint of the TFC 115 is at least as large as a footprint of the component 135.

In one embodiment, the TFC 115 is embedded in a layer of the package substrate 113. For example, and in one embodiment, a TFC 115 is positioned in a topmost layer of the package substrate 113. For another example, and in one embodiment, a TFC 115 is positioned in a bottommost layer of the package substrate 113. For yet another example, and in one embodiment, a TFC 115 is positioned in a middle layer of the package substrate 113. In one embodiment, two or more TFCs 115 are positioned in the same or different layers of the package substrate 113.

With regard now to the electronic package portion 150, a closer view of the TFC 115 is shown. As shown, the electronic package portion 150 comprises a TFC 115. In one embodiment, the TFC 115 comprises a bottom electrode 129, a capacitor dielectric layer 123 on the bottom electrode 129, and a top electrode 125 on the capacitor dielectric layer 123. Each of the top electrode 125 and the bottom electrode 129 may be formed from a conductive material (e.g., a metal, a metal alloy, etc.). In one embodiment, the top electrode 125 is a $V_{CC}$ electrode and the bottom electrode 129 is a $V_{SS}$ electrode. In one embodiment, the bottom electrode 129 is a $V_{CC}$ electrode and the top electrode 125 is a $V_{SS}$ electrode. The capacitor dielectric layer 123 may be formed from a capacitor dielectric (e.g., a high-k dielectric, etc.). Furthermore, while the capacitor dielectric layer 123 is shown as a single layer, it is to be appreciated that the capacitor dielectric layer 123 may comprise a stack of two or more layers where at least one of the layers is a high k dielectric. As used herein, high k dielectrics refer to dielectrics that have a k value that is greater than 10. In an embodiment, a high k dielectric may include one or more of hafnium oxide, hafnium silicon oxide, lanthanum oxide, lanthanum aluminum oxide, zirconium oxide, zirconium silicon oxide, hafnium zirconium oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In one embodiment, the electronic package portion 150 includes openings 137A-137B. The opening 137A is in the capacitor dielectric layer 123 and the opening 137B is in the top electrode 125. The openings 137A-137B are positioned over one another and reveal a surface of the bottom electrode 129. The electronic package portion 150 also includes a vertical interconnect access (via) 131A over the top electrode 125, a via 131B through the openings 137A-137B that lands on the bottom electrode 129, and a via 131C on a pad 139. Additionally, the electronic package portion 150 includes a pad 121A on the via 131A, a pad 121B on the via 131B, and a pad 121C on the via 131C. Also, interconnects 107A-107C (e.g., bumps, pillars, etc.) are on the pads 121A-121C, respectively. Interconnects 107A-107C may be, for example, solder, copper, other conductive materials known in the art, or any combination thereof.

Each of the top electrode 125, the capacitor dielectric layer 123, the bottom electrode 129, the pad 139, the vias 131A-131C, the openings 137A-137B is positioned or embedded in a build-up layer 127. Furthermore, a solder resist layer 117 is positioned on the build-up layer 127. The solder resist layer 117 comprises solder resist openings that expose surfaces of the pads 121A-121C so that interconnects 107A-107C can be positioned on the exposed surfaces of the pads 121A-121C. The build-up layer 127 may be formed from a build-up film. In one embodiment, the build-up layer 127 is the topmost or bottommost layer of the package substrate 113. In one embodiment, the build-up layer 127 is below the topmost or above the bottommost layer of the package substrate 113.

The embodiment of the electronic package portion 150 illustrated in FIG. 1 shows build-up layer 127 as being the topmost layer of the package substrate 113. Given that the build-up layer 127 is the topmost layer of the package substrate 113, the in situ TFC 115 that is embedded in the build-up layer 127 is placed as close as possible to the component 135 on the package substrate 113. In this way, a decoupling capacitance can be provided to the component 135. Placement of the in situ TFC 115 in the topmost layer of the electronic package 113 is advantageous because the placement enables the in situ TFC 115 to have a low inductance path to the component 135. But there are other factors that influence the design, so it should be appreciated that the TFC can be in any layer of the package substrate.

Referring now to FIGS. 2A-2D, a series of cross-sectional illustrations and corresponding plan view illustrations are shown in order to more clearly illustrate the construction of the TFC 115. Particularly, the cross-sectional illustrations depict a portion of the TFC 115 within the electronic portion 150 and the plan view illustrations depict the entire TFC 115. That is, while a single $V_{CC}/V_{SS}$ via pair is shown in the cross-sectional views, a plurality of $V_{CC}/V_{SS}$ via pairs across the entire TFC 115 is shown in the plan views. The electronic package portion 150 shown in FIGS. 2A-2D includes components that are described above in connection with FIG. 1. For brevity, these components are not described again unless such description is necessary to understand FIGS. 2A-2D.

Figure 2A:
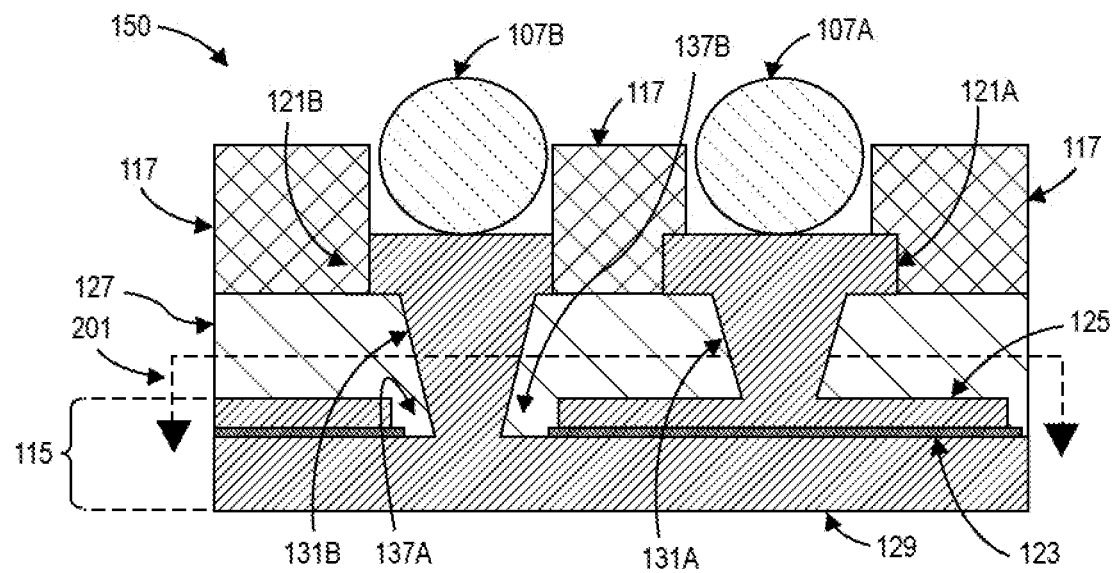
FIG. 2A includes a cross-sectional side view illustration of an electronic package portion and a plan view of the electronic package portion above the TFC, according to one embodiment.
Figure 2A:
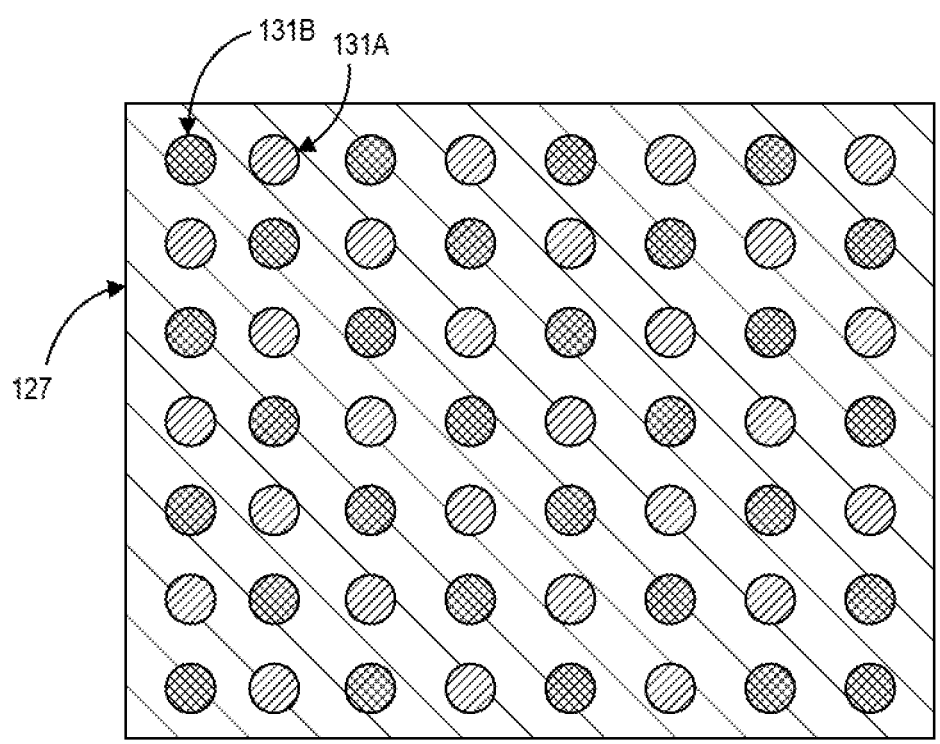

FIG. 2A includes a cross-sectional side view illustration of the electronic package portion 150 and a plan view of the electronic package portion 150 along a horizontal plane 201, according to one embodiment. In FIG. 2A, the cross-sectional side view of the electronic package portion 150 is shown with the horizontal plane 201 passing through the electronic package portion 150 above the TFC 115. The plan view in FIG. 2A shows that the vias 131A-131B are positioned or embedded in the build-up layer 127. Any arrangement of the vias 131A-131B in the build-up layer 127 is possible. One possible arrangement includes interspacing the vias 131A with the vias 131B, as shown in the plan view in FIG. 2A.

In an embodiment, when the top electrode 125 is a $V_{CC}$ electrode, the via 131A is a $V_{CC}$ via. In one embodiment, when the top electrode 125 is a $V_{SS}$ electrode, the via 131A is a $V_{SS}$ via. In one embodiment, when the bottom electrode 129 is a $V_{CC}$ electrode, the via 131B is a $V_{CC}$ via. In one embodiment, when the bottom electrode 129 is a $V_{SS}$ electrode, the via 131B is a $V_{SS}$ via.

Figure 2B:
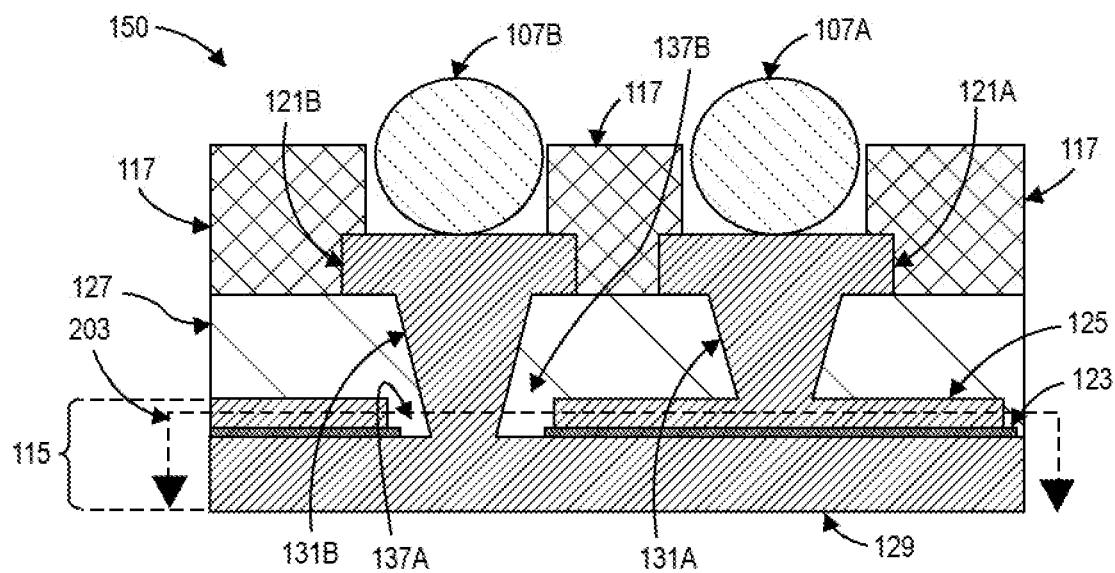
FIG. 2B includes a cross-sectional side view illustration of an electronic package portion and a plan view of the electronic package portion through the top electrode of the TFC, according to another embodiment.
Figure 2B:
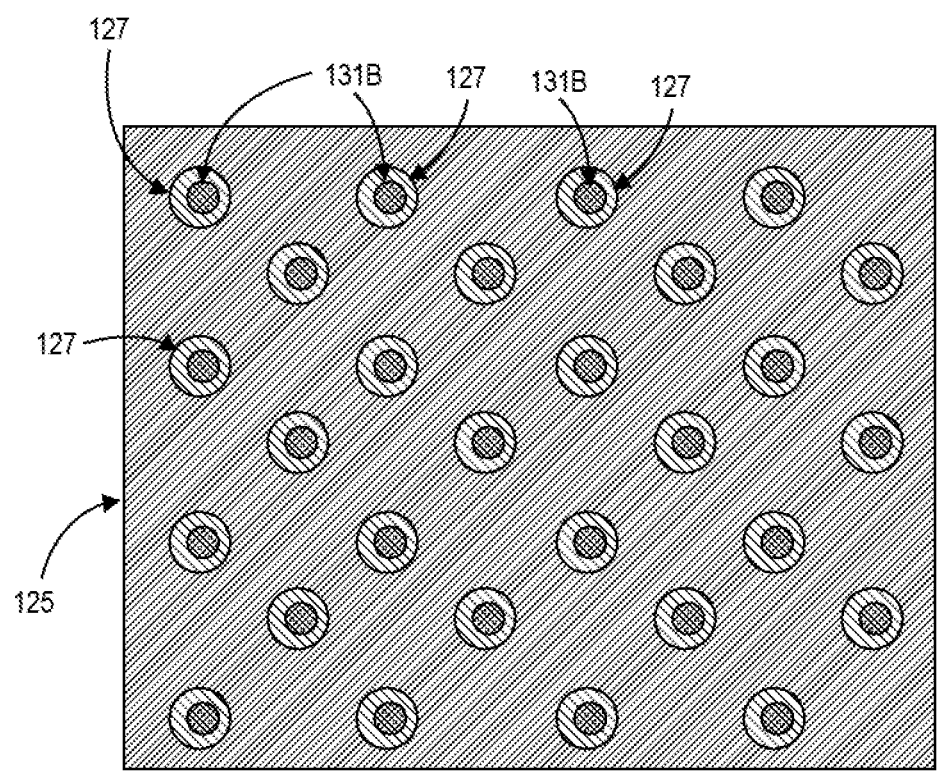

FIG. 2B includes a cross-sectional side view illustration of the electronic package portion 150 and a cross-sectional plan view of the electronic package portion along a horizontal plane 203. In FIG. 2B, the cross-sectional side view of the electronic package portion 150 is shown with the horizontal plane 203 passing through the top electrode 125.

The cross-sectional side view in FIG. 2B shows that the capacitor dielectric layer 123 and the top electrode 125 comprise openings 137A-137B, respectively. The openings 137A-137B, which are over one another, expose a surface of the bottom electrode 129. Moreover, the cross-sectional side view in FIG. 2B shows that a via 131B makes contact with the exposed surface of the bottom electrode 129. The plan view in FIG. 2B shows that the vias 131B pass through the top electrode 125, which is a continuous layer comprising openings 137B. That is, while the cross-sectional illustration depicts the top electrode 125 as being discrete portions, it is to be appreciated that the top electrode 125 may be a continuous layer with openings 137B to accommodate the vias 131B. The plan view in FIG. 2B also shows that the vias 131B are positioned or embedded in the build-up layer 127.

Figure 2C:
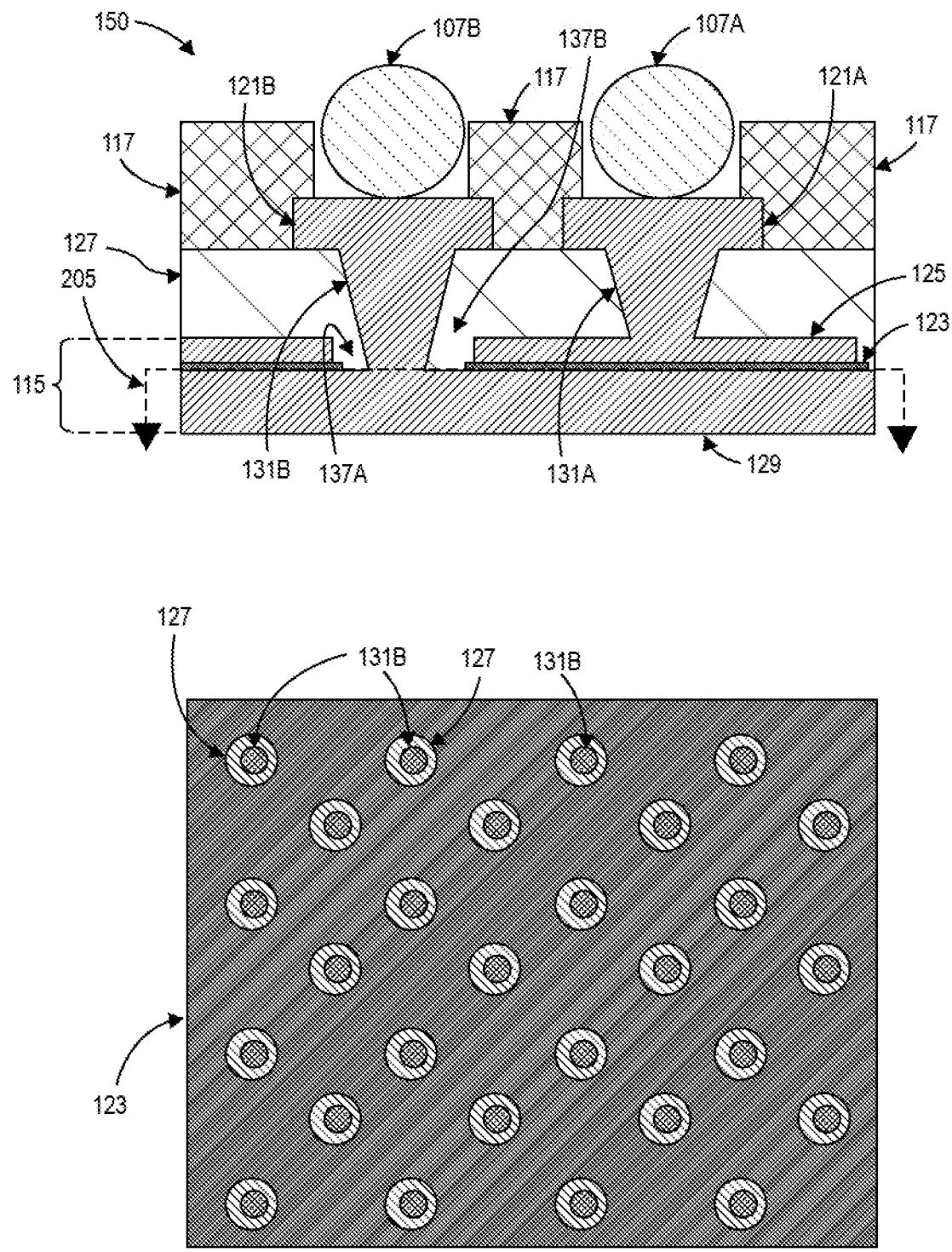
FIG. 2C includes a cross-sectional side view illustration of an electronic package portion and a plan view of the electronic package portion through the dielectric layer of the TFC, according to another embodiment.

FIG. 2C includes a cross-sectional side view illustration of the electronic package portion 150 and a cross-sectional plan view of the electronic package portion 150 along a horizontal plane 205, according to one embodiment. In FIG. 2C, the cross-sectional side view of the electronic package portion 150 is shown with the horizontal plane 205 passing through the capacitor dielectric layer 123.

The cross-sectional side view in FIG. 2C is similar to or the same as the cross-sectional side view described above in connection with FIGS. 2A-2B. The plan view in FIG. 2C shows that the vias 131B pass through the capacitor dielectric layer 123, which is a continuous layer comprising openings 137A. That is, while the cross-sectional illustration depicts the capacitor dielectric layer 123 as being discrete portions, it is to be appreciated that the capacitor dielectric layer 123 may be a continuous layer with openings 137A to accommodate the vias 131B. The plan view in FIG. 2C also shows that the vias 131B are embedded in the build-up layer 127.

Figure 2D:
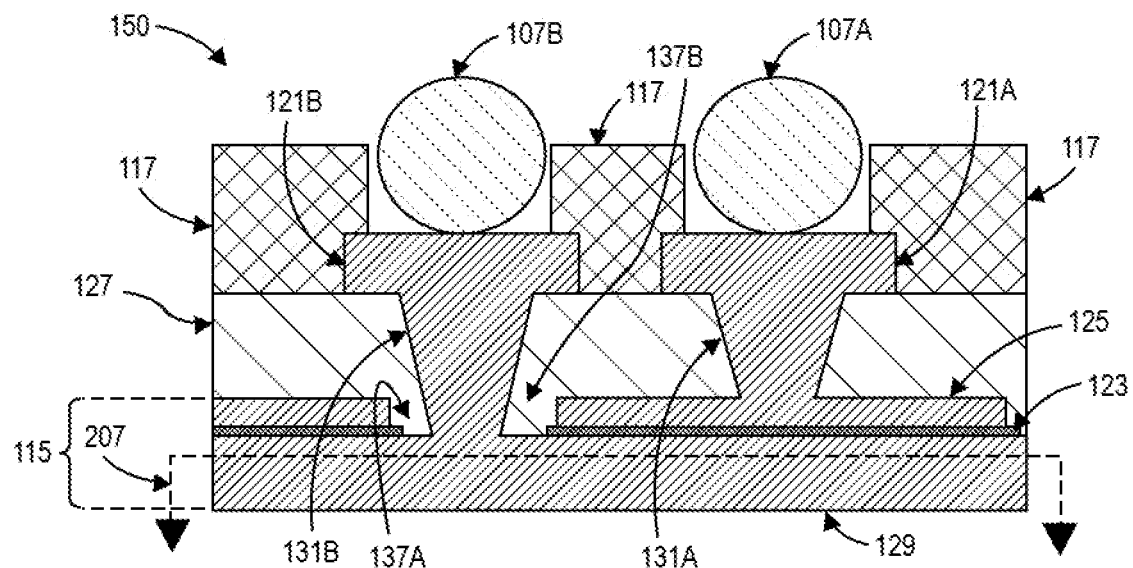
FIG. 2D includes a cross-sectional side view illustration of an electronic package portion and a plan view of the electronic package portion through the bottom electrode of the TFC, according to yet another embodiment.
Figure 2D:
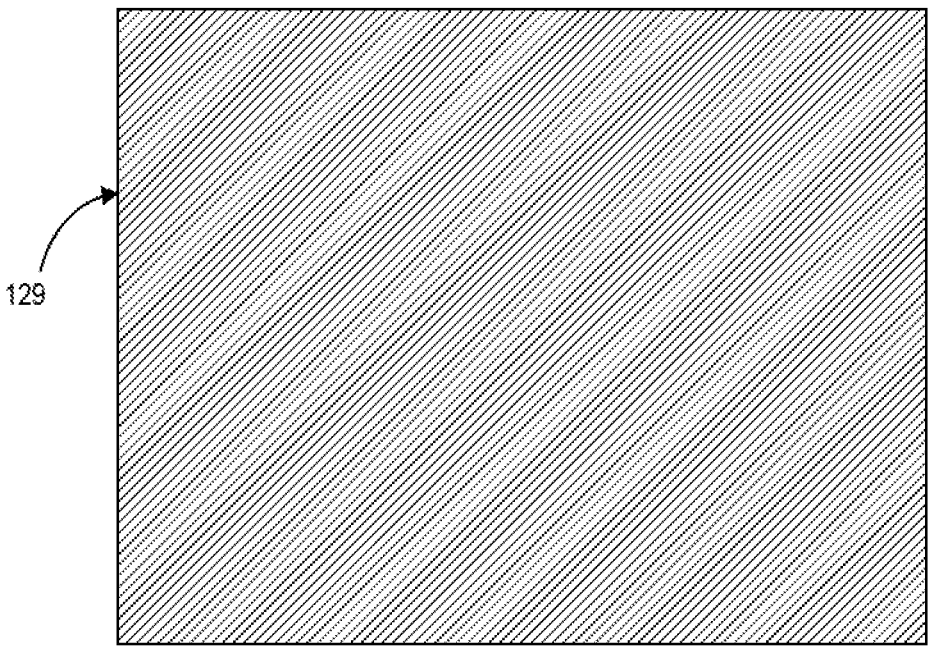

FIG. 2D includes a cross-sectional side view illustration of the electronic package portion 150 and a cross-sectional plan view of the electronic package portion 150 along a horizontal plane 207, according to yet another embodiment. The cross-sectional side view of the electronic package portion 150 is shown with the horizontal plane 207 passing through the bottom electrode 129. The cross-sectional side view in FIG. 2D is similar to or the same as the cross-sectional side view described above in connection with FIGS. 2A-2B. The plan view in FIG. 2D shows the bottom electrode as a continuous layer with no openings therein.

FIGS. 2A-2D show that the electrical path from the top electrode 125 to the pad 121A is bridged by the via 131A and that the electrical path from the bottom electrode 129 to the pad 121B is bridged by a via 131B that passes through the opening 137A in the capacitor dielectric layer 123 and the opening 137B in the top electrode 125. Consequently, the vias 131A-131B, the pads 121A-121B, and the openings 137A-137B make it possible for the TFC 115 to be coupled to interconnects 107A-107B, which in turn enable the TFC 115 to be coupled to other components (e.g., component 135 described above in connection with FIG. 1, etc.). This architecture enables the TFC 115 to be placed as close as possible to the component 135, which in turn enables the TFC 115 to provide a decoupling capacitance with low inductance.

The plan view illustrations in FIGS. 2A-2D show the electronic package portion 150's components (e.g., the capacitor dielectric layer 123, the top electrode 125, the bottom electrode 129, etc.) as rectangular components. Other embodiments, however, are not so limited. For example, and in one embodiment, the TFC 115's components can have any shape (e.g., circular, oval, triangular, etc.) or size.

Figure 3A:
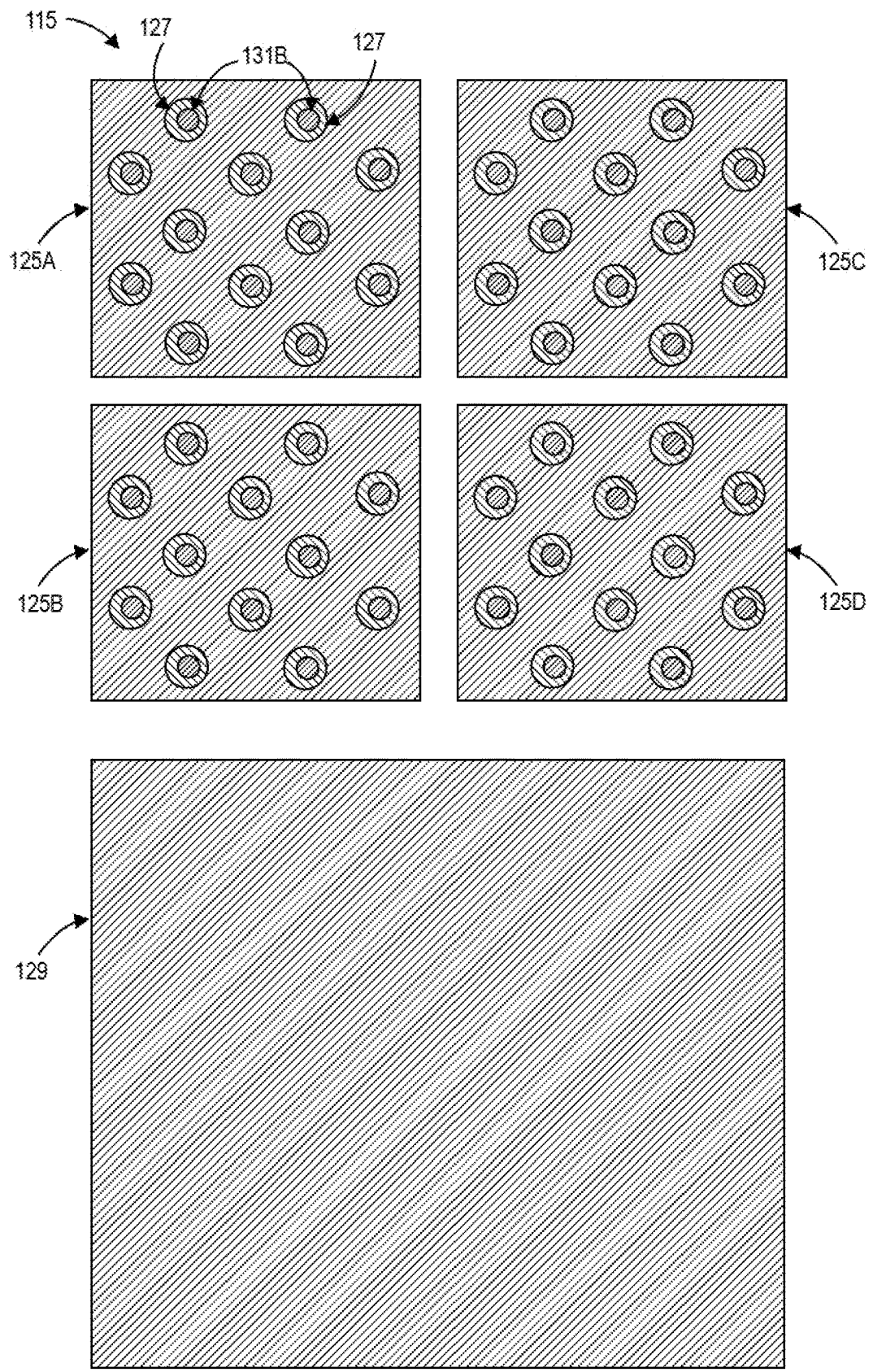
FIG. 3A includes plan view illustrations of a TFC that comprises a capacitor dielectric layer, a top electrode layer with a plurality of distinct electrodes, and a bottom electrode layer, according to one embodiment.
Figure 3B:
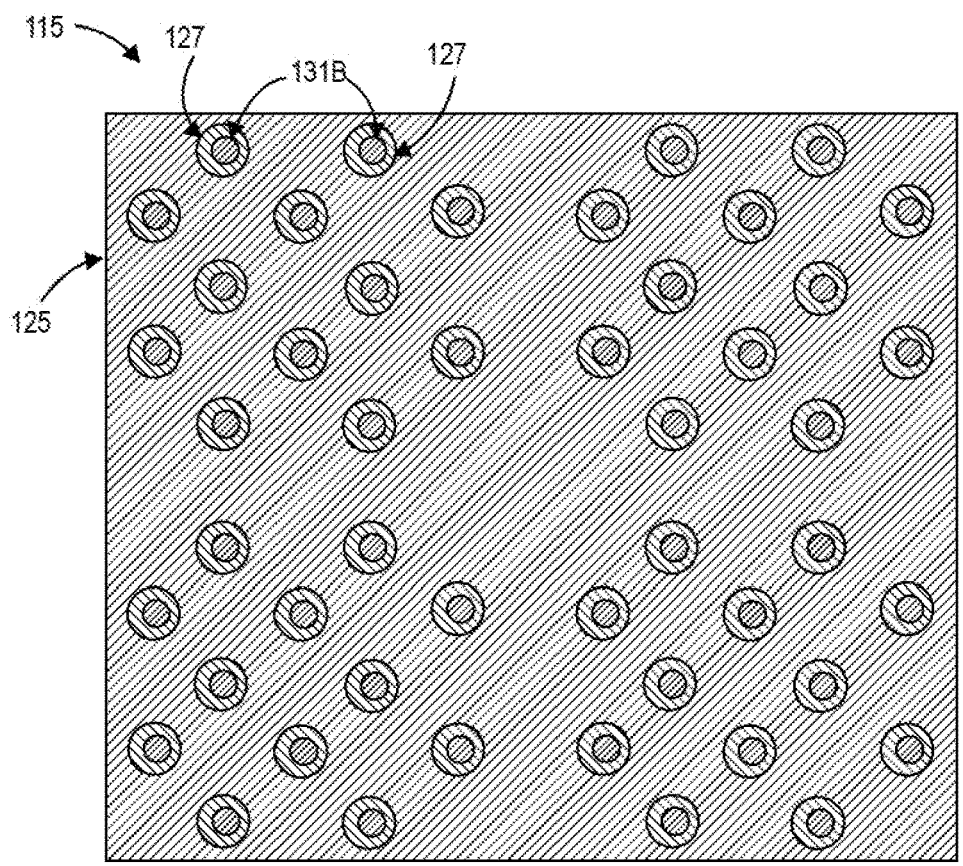
FIG. 3B includes plan view illustrations of a TFC that comprises a capacitor dielectric layer, a top electrode layer, and a bottom electrode layer with a plurality of distinct electrodes, according to another embodiment.
Figure 3B:
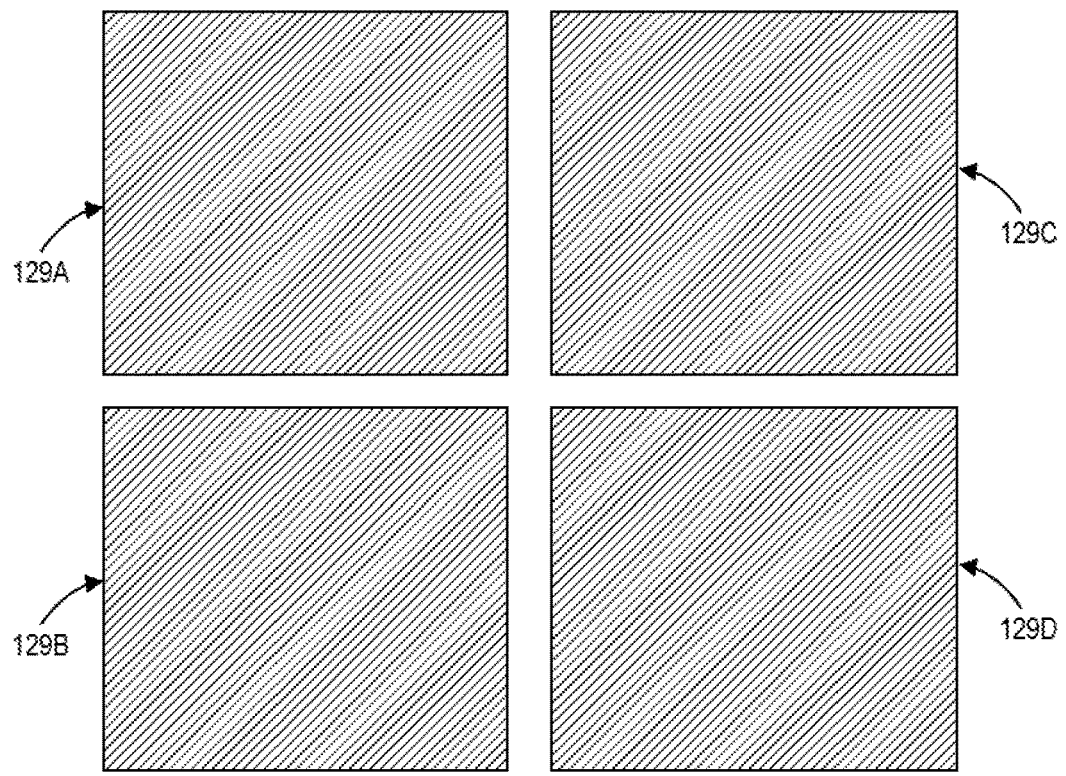
Figure 3C:
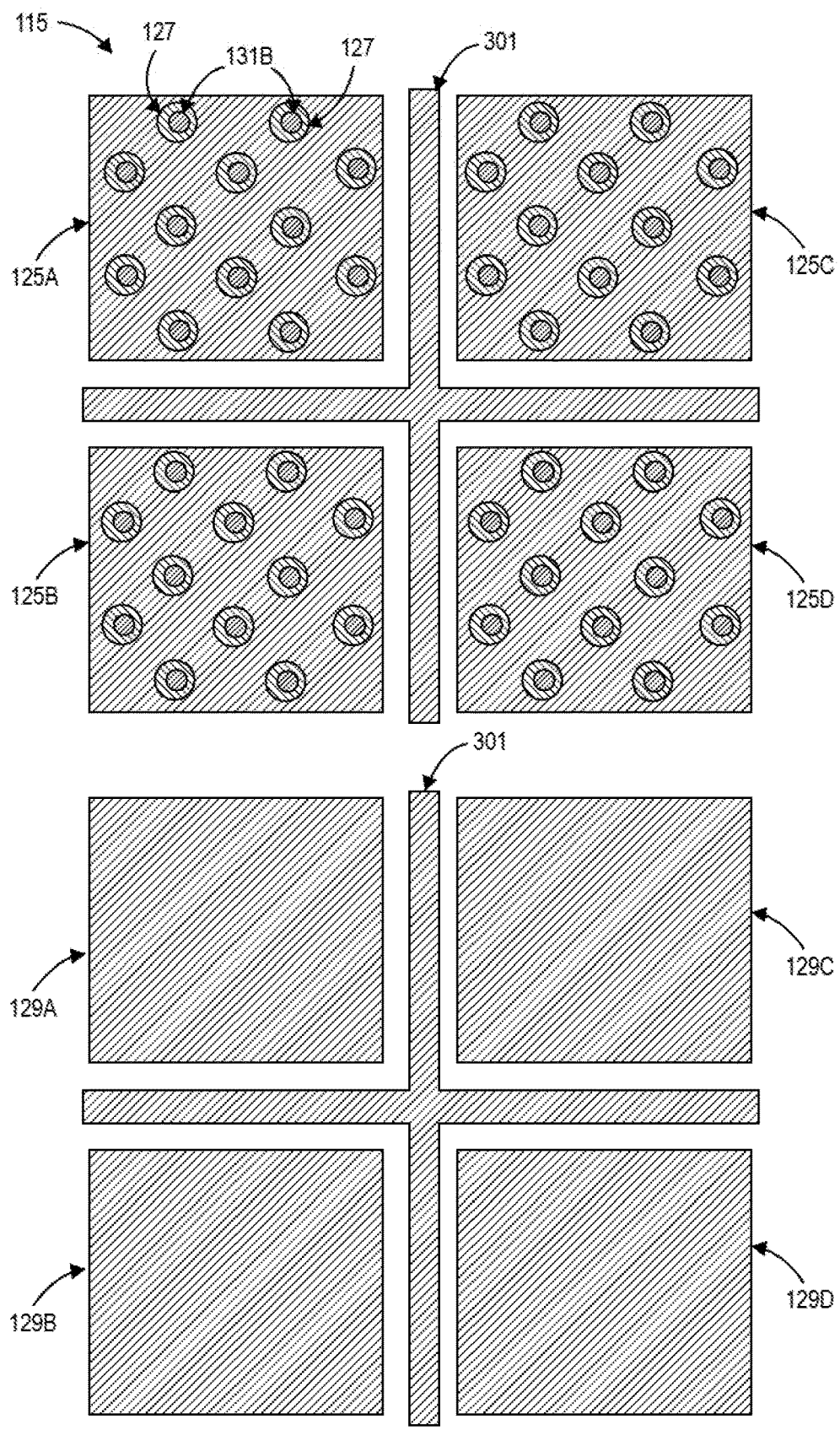
FIG. 3C includes plan view illustrations of a TFC that comprises a capacitor dielectric layer, a top electrode layer with a plurality of distinct electrodes, a bottom electrode layer with a plurality of distinct electrodes, and ground shields around the plurality of distinct electrodes, according to yet another embodiment.

Referring now to FIGS. 3A-3C, additional plan view illustrations of a top electrode layer and a bottom electrode layer of the TFC 115 are shown, in accordance with various embodiments. Particularly, FIGS. 3A-3C depict different architectures that provide enhanced design flexibility. For example, the TFC 115 shown in FIGS. 3A-3C may be segmented to provide individualized power domains. This is particularly beneficial for supplying decoupling capacitance to components that include more than one processing core. In such embodiments, each processing core may be serviced by a different capacitor. Furthermore, embodiments allow for shielding of each of the power domains to limit crosstalk.

The TFC 115 shown in FIGS. 3A-3C includes components that are described above in connection with FIGS. 1-2D. For brevity, these components are not described again unless such description is necessary to understand FIGS. 3A-3C.

FIG. 3A includes plan view illustrations of a top electrode layer 125 (above) and a bottom electrode layer 129 (below) of a TFC 115, according to one embodiment. In an embodiment, a capacitor dielectric layer (not shown) would separate the top electrode layer 125 from the bottom electrode layer 129 similar to what is shown above in FIGS. 2A-2D. As shown, the top electrode layer 125 comprises four distinct top electrodes 125A-125D (e.g., power domains, ground domains, etc.) that are separated from each other, while the bottom electrode layer 129 comprises a single bottom electrode 129. The single bottom electrode 129 has a total size (in the x-y plane) that spans all of the four distinct top electrodes 125A-125D. Unlike MLCCs and ex situ TFC capacitors, the TFC 115 can be customized to match the architecture of a component. This is advantageous because a required or desired decoupling capacitance can be provided to one or more components in a semiconductor package. For example, and for one embodiment, each of the four electrodes 125A-125D can be associated with a single core in a multicore processor. In this way, each core is provided with a separate in situ TFC. Consequently, each core may be provided with an individualized decoupling capacitance.

FIG. 3B includes plan view illustrations of a top electrode layer 125 (above) and a bottom electrode layer 129 (below) of a TFC 115, according to another embodiment. In an embodiment, a capacitor dielectric layer (not shown) would separate the top electrode layer 125 from the bottom electrode layer 129 similar to what is shown above in FIGS. 2A-2D. As shown, the top electrode layer 125 comprises a single top electrode 125, while the bottom electrode layer 129 comprises four distinct bottom electrodes 129A-129D (e.g., power domains, ground domains, etc.) that are separated from each other. The single top electrode 125 has a total size (in the x-y plane) that spans all of the four distinct bottom electrodes 129A-129D. Unlike MLCCs and ex situ TFC capacitors, the TFC 115 can be customized to match the architecture of a component. This is advantageous because a required or desired decoupling capacitance can be provided to one or more components in a semiconductor package. For example, and for one embodiment, each of the four bottom electrodes 129A-129D can be associated with a single core in a multicore processor. In this way, each core is provided with a separate in situ TFC and, consequently, an individualized decoupling capacitance.

FIG. 3C includes plan view illustrations of a top electrode layer 125 (above) and a bottom electrode layer 129 (below), according to yet another embodiment. In an embodiment, a capacitor dielectric layer (not shown) would separate the top electrode layer 125 from the bottom electrode layer 129 similar to what is shown above in FIGS. 2A-2D. As shown, the top electrode layer 125 comprises four distinct top electrodes 125A-125D (e.g., power domains, ground domains, etc.), while the bottom electrode layer 129 comprises four distinct bottom electrodes 129A-129D (e.g., power domains, ground domains, etc.). The four distinct top electrodes 125A-125D are separated from each other by a ground shield 301. The four distinct bottom electrodes 129A-129D may also be separated from each other by the ground shield 301. The ground shield 301 can be a continuous structure that includes lithographic or laser drilled vias.

Unlike MLCCs and ex situ TFC capacitors, the TFC 115 shown in FIG. 3C can be customized to match the architecture of a component. This is advantageous because a required or desired decoupling capacitance can be provided to one or more components in a semiconductor package. For example, and for one embodiment, each of the four distinct bottom electrodes 129A-129D, which corresponds to one of the four distinct top electrodes 125A-125D, can be associated with a single core in a multicore processor. In this way, each core is provided with a separate in situ TFC and, consequently, an individualized decoupling capacitance.

It is to be appreciated that the ground shield 301 can be used with any one of the embodiments set forth in FIGS. 3A-3C. Furthermore, each of the electrode layers shown in FIGS. 3A-3C is not limited to four distinct electrodes and can have any number of distinct electrodes. Furthermore, the shapes and sizes of the electrode layers or the distinct electrodes are not limited to rectangular shapes and can have any shape or size. Furthermore, in a single electrode layer, two or more distinct electrodes can have differing shapes and sizes.

Figure 4C:
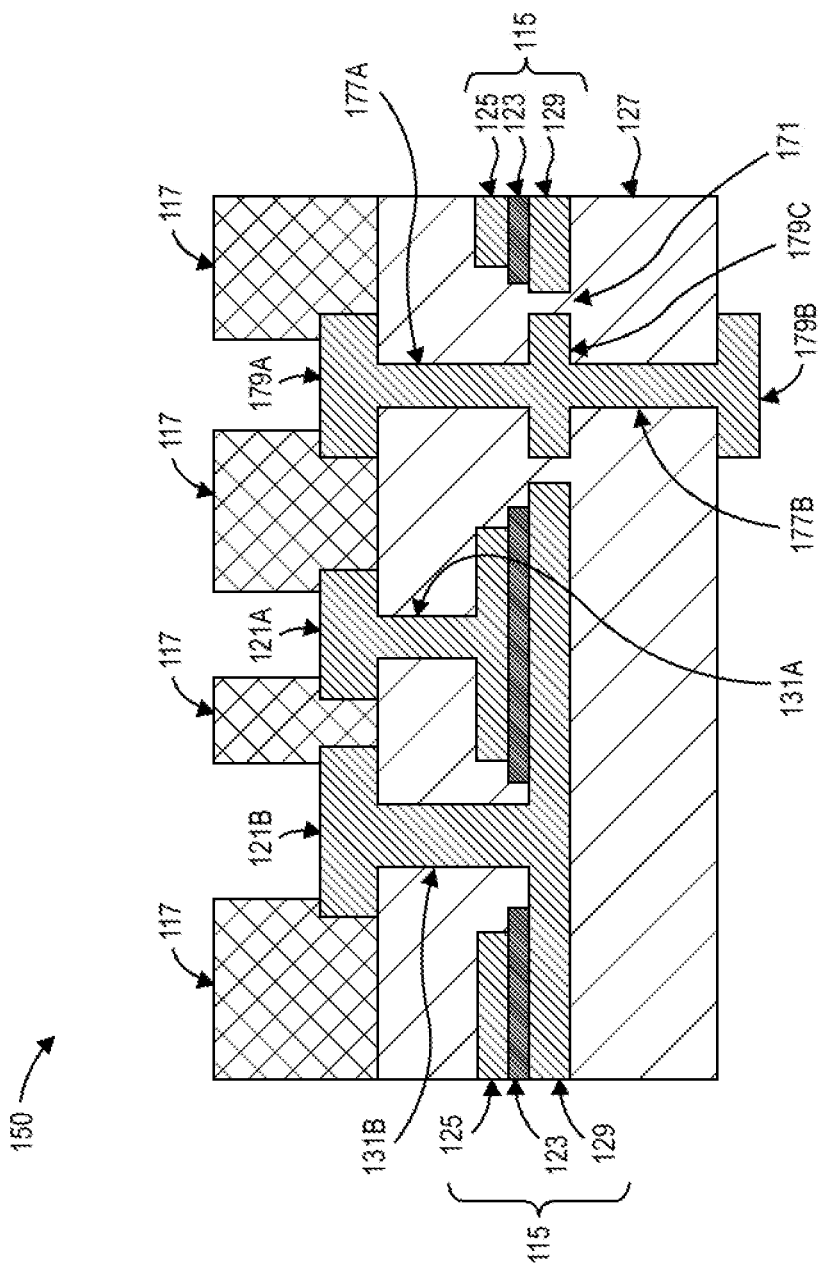
FIG. 4C is a cross-sectional side view illustration of an electronic package portion that comprises a TFC and lithographic vias, according to yet another embodiment.

FIGS. 4A-4C are cross-sectional side view illustrations of the electronic package portion that comprises the TFC 115 and vias, according to several embodiments. The electronic package portion 150 shown in FIGS. 4A-4C includes components that are described above in connection with FIGS. 1-3C. For brevity, these components are not described again unless such description is necessary to understand FIGS. 4A-4C.

FIG. 4A is a cross-sectional side view illustration of the electronic package portion 150 that comprises the TFC 115 and laser drilled vias 131A-131C, according to one embodiment. As shown in FIG. 4A, a thickness of the top electrode 125 is represented as $T_1$ and a thickness of the bottom electrode 129 is represented as $T_2$. In one embodiment, $T_1$ is less than $T_2$. In one embodiment, $T_1$ ranges from 5 μm to 25 μm. In one embodiment, $T_2$ ranges from 15 μm to 35 μm. In one embodiment, $T_2$ is equal to or approximately equal to the thickness of a standard metal layer (e.g., a thickness that ranges from 5 μm to 25 μm, etc.). In a particular embodiment, the thickness $T_1$ is less than the typical thickness of a metal layer in the package substrate.

In the embodiment shown in FIG. 4A, the bottom electrode 129 is a polished metal layer that is encapsulated by a dielectric 127B. Before polishing the bottom electrode layer 129, the bottom electrode layer 129 is laminated with the dielectric 127B. Then after polishing, the capacitor dielectric layer 123 and the top electrode 125 are deposited or formed, and subsequently, laminated with the dielectric 127A. Then the vias 131A-131C are laser drilled in the dielectric 127A As shown, the capacitor dielectric layer 123 is positioned on the bottom electrode 129. The top electrode 125 may include a sputtered thin film that is capped with a thicker electroplated layer of metal (e.g., copper, etc.) to reduce equivalent series resistance (ESR) and provide resilience to laser drilling. As shown, each of the top electrode layer 125 and the pad 139 is encapsulated by a dielectric (e.g., an organic dielectric, etc.) 127A and vias 131A-131C are formed by laser drilling holes in the dielectric 127A and filling the holes with metal (e.g., copper, etc.). Furthermore, the contact pads 121A-121C are formed on the dielectric 127A before laminating and patterning the solder resist layer 117 using known techniques. In one embodiment, the dielectrics 127A-127B are formed from the same dielectric material.

FIG. 4B is a cross-sectional side view illustration of the electronic package portion 150 that comprises a TFC 115 and lithographic vias 131A-131C, according to one embodiment. FIG. 4B is similar to or the same as FIG. 4A, with the exception that FIG. 4B includes lithographically defined vias. That is, the vias 131A-C shown in FIG. 4A are laser drilled vias, while the vias 131A-C shown in FIG. 4B are lithographically defined vias. The difference between laser drilled vias and lithographically defined vias may be identified by the profile of the via. For example, laser drilled vias typically have tapered sidewall profiles and lithographically defined vias will typically exhibit vertical sidewall profiles. Any lithographic process for forming vias known in the art may be used to form the vias in FIG. 4B.

FIG. 4C is a cross-sectional side view illustration of the electronic package portion 150 that comprises a TFC 115 and lithographic vias 131A-131B and 177A-177B, according to yet another embodiment. In one embodiment, the TFC 115 (i.e., the capacitor dielectric layer 123, the top electrode 125, and the bottom electrode 129) includes an opening 171. In this embodiment, vias 177A-177B and a pad 179C may be positioned through or in the opening 171. Moreover, and in this embodiment, the vias 177A-177B and the pad 179C couple a pad 179A above the build-up layer 127 to a pad 179B under the build-up layer 127. The embodiment shown in FIG. 4C shows that the TFC 115 can be designed to include openings that allow for one or more layers or components under the bottom electrode 129 to be coupled to one or more layers or components above the top electrode 125. Pads 121A-121B and 179A may be positioned on the build-up layer 127. A solder resist layer 117 may be laminated over the pads 121A-121B and 179A and patterned to expose surfaces of the pads 121A-121B and 179A so that interconnects (not shown) may be positioned on the pads 121A-121B and 179A.

Figure 5C:
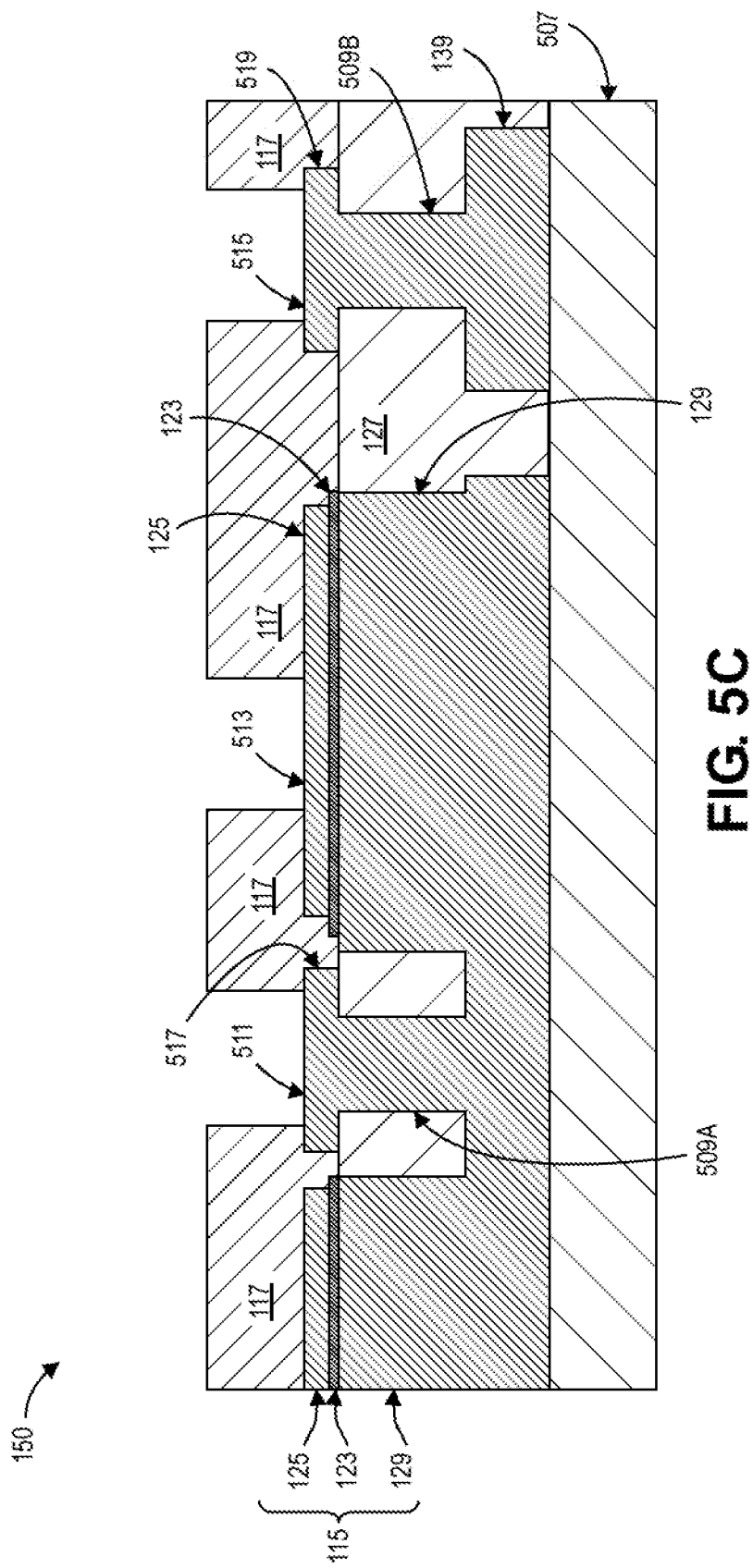
FIG. 5C is a cross-sectional side view illustration of an electronic package portion that includes a TFC on a topmost layer of an electronic package that includes a via, according to yet another embodiment.

FIGS. 5A-5C are cross-sectional side view illustrations of the electronic package portion 150 that includes a TFC 115, according to several embodiments. The electronic package portion 150 illustrated in FIGS. 5A-5C includes components that are described above in connection with FIGS. 1-4D. For brevity, these components are not described again unless such description is necessary to understand FIGS. 5A-5C.

FIG. 5A is a cross-sectional side view illustration of the electronic package portion 150 that includes a TFC 115 on a layer 507 of package substrate, according to one embodiment. As shown, the bottom electrode 129 is positioned over the layer 507 of the electronic package portion 150. In an embodiment, a solder resist 117 may be laminated over the TFC 115. Since the bottom electrode 129 is over the layer 507, the solder resist 117 may be disposed along sidewalls of the bottom electrode layer 129. Consequently, and for this embodiment, the TFC 115 is placed close to the component (e.g., component 135 described above in connection with FIG. 1, etc.). In this way, a decoupling capacitance can be provided to the component.

Forming the TFC 115 includes patterning a metal layer over the layer 507 to have a near continuous layer of metal (e.g., copper, etc.) to form a bottom electrode 129. As shown, the patterning may also define a pad 139. Accordingly, a thickness of the pad 139 may be substantially equal to a thickness of the bottom electrode 129. After thin-film deposition processes are used to deposit the capacitor dielectric layer 125 on the bottom electrode 129, an additional metal layer is plated on the capacitor dielectric layer 123 to form the top electrode 125 for the TFC 115. In one embodiment, the metal layer that is used as the top electrode 125 is thinner than standard metal layers. In this way, the overall top metal layer will not be too thick for lamination with the solder resist layer 117, but will be thick enough to achieve a desired ESR. For example, the top electrode 125 can have a thickness that ranges from 5 μm to 25 μm, while a standard metal layer can have a thickness that ranges from 5 μm to 25 μm.

As shown in FIG. 5A, the top electrode 125 and the capacitor dielectric 123 are etched prior to lamination with the solder resist layer 117 to form openings that expose a surface of the bottom electrode 129. In one embodiment, a solder resist layer 117 is laminated on surfaces of the top electrode 125, the capacitor dielectric 123, the bottom electrode 129, and the pad 139. Next, the solder resist layer 117 is patterned to form openings that expose a surface 501 of the bottom electrode 129, a surface 503 of the top electrode 125, and a surface 505 of the pad 139. Interconnects (e.g., bumps, pillars, etc.) may be formed on the surfaces 501, 503, and 505.

FIG. 5B is a cross-sectional side view illustration of an electronic package portion 150 that includes a TFC 115, according to another embodiment. The electronic package portion 150 shown in FIG. 5B is similar to the electronic package portion 150 shown in FIG. 5A, with the exception that the bottom electrode 129 is embedded in a build-up layer 127. That is, sidewalls of the bottom electrode 129 are covered by the build-up layer 127 instead of the resist layer 117. Such an embodiment allows for the bottom electrode 129 to have a polished surface. Polishing the surface of the bottom electrode 129 can improve properties of the TFC in some cases. For example, the electronic package portion 150 may be fabricated by disposing a metal layer and patterning the metal layer to form the bottom electrode 129 and a pad 139. This may be followed by laminating a build-up layer 127 over the bottom electrode 129 and the pad 139. The build-up layer 127, the bottom electrode 129, and the pad 139 may then be polished to reveal the bottom electrode 129 and the pad 139, where each of the bottom electrode 129 and the pad 139 are left with a polished surface.

FIG. 5C is a cross-sectional side view illustration of an electronic package portion 150 that includes a TFC 115 with a bottom electrode 129 that is a lithographically defined via layer through a build-up layer 127 of an electronic package, according to another embodiment. The TFC 115 differs from the one in FIG. 5B in that the bottom electrode 129 is a lithographically defined via. That is, the bottom electrode 129 has the same thickness (and is in the same layer) as vias 509A and 509B. For example, a connection to the bottom electrode 129 may be made by via 509A that extends down to a metal layer 507 which then connects to the bottom electrode 129 (from below).

In one embodiment, a lithography technique is used to simultaneously fabricate the bottom electrode 129 and the vias 509A-B. In other words, the bottom electrode 129 and the vias 509A-B, are plated in a single operation. After plating is complete, a dielectric (e.g., an organic dielectric) 127 is laminated on the bottom electrode 129 and the vias 509A-B. The laminated dielectric 127 may be planarized to expose surfaces of the bottom electrode 129 and the vias 509A-509B and to provide a surface for the deposition of the capacitor dielectric layer 123. In one embodiment, the capacitor dielectric layer 123 comprises a capacitor layer stack with minimized roughness that may or may not comprise barrier metals. For example, and for one embodiment, the capacitor dielectric layer 123 comprises a capacitor dielectric stack, where the capacitor dielectric stack comprises one or more capacitor dielectrics and one or more barrier metals. For another example, and for one embodiment, the capacitor dielectric layer 123 comprises a capacitor dielectric stack, where the capacitor dielectric stack comprises one or more capacitor dielectrics and no barrier metals. Moving on, the capacitor dielectric layer 123 is then deposited on the exposed surface of the bottom electrode 129 and the top electrode 125 is deposited (e.g., plated, etc.) on the capacitor dielectric layer 123. Furthermore, pads 517 and 519 are formed on vias 509A-509B, respectively. Next, a solder resist layer 117 is laminated on surfaces of the top electrode 125, the capacitor dielectric layer 123, the pad 511, and the pad 519. The solder resist layer 117 is then patterned to form solder resist openings that expose a surface 511 of the pad 517 coupled to the bottom electrode 129, a surface 513 of the top electrode 125, and a surface 515 of the pad 519 coupled to the pad 139. Interconnects (e.g., bumps, pillars, etc) may be formed on the surfaces 511, 513, and 515.

Figure 6E:
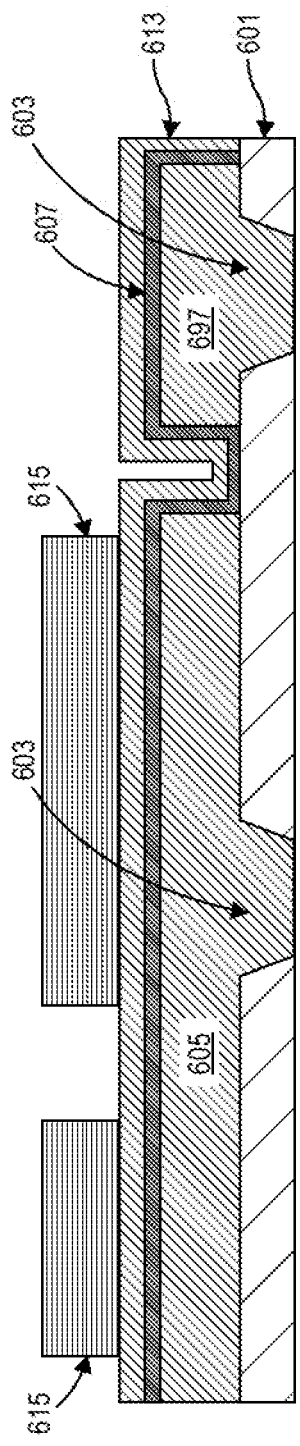

FIGS. 6A-6G are a cross-sectional side view illustration of a process of fabricating an in situ TFC 699 in an electronic package, according to one embodiment. With regard now to FIG. 6A, a build-up layer 601 is shown. In FIG. 6B, vias 603 are drilled into the build-up layer 601. Also, and as shown in FIG. 6B, a metallic material is deposited on the build-up layer 601 and in the vias 603. The deposited metallic material is then processed to form a bottom electrode layer 605 and a pad 697. For example, a semi-additive process (SAP) may be used to form the bottom electrode layer 605 and the pad 697. Next, and as shown in FIG. 6C, a capacitor dielectric layer 607 is deposited on the bottom electrode layer 605 and the pad 697. In one embodiment, the capacitor dielectric layer 607 comprises a capacitor dielectric stack that can be made of one or more capacitor dielectric materials. This embodiment is relevant in the case that both the top and bottom electrode metals are either the same or both show good barrier characteristics towards the capacitor dielectric material(s). The word "barrier" in this case refers to both a good electronic barrier for carrier transport as well as a chemical barrier to suppress reactions between the capacitor dielectric and the electrode material. In another embodiment, the capacitor dielectric layer 607 comprises a capacitor dielectric stack that comprises a high k dielectric 609 sandwiched between two barrier metals, e.g., the two barrier metal layers 611. In one embodiment, the barrier layers 611 are either metals or semi-metals, where the term "metal" also encompasses alloy materials, e.g., metal alloys with sufficient conductivity to act as part of the electrode in a finished capacitor structure. In yet another embodiment, the capacitor dielectric stack can be comprised of the capacitor dielectric layer and one barrier layer either on the top or the bottom of the capacitor dielectric layer. This embodiment is relevant if the electrode metal on top and bottom are made of different materials and one of them requires a barrier metal to improve/enable capacitor operation. The barrier metals can be nickel, palladium, gold, platinum, iridium, osmium, rhodium, tellurium, iron, or any other metal. Ideally the barrier metals are deposited in the same tool as the dielectric layer without a break of vacuum/environment. Such a process is typical for multi-stage sputtering systems. Moving on to FIG. 6D, another metallic material is deposited on the capacitor dielectric layer 607 and processed to complete a top electrode layer 613.

Figure 6F:
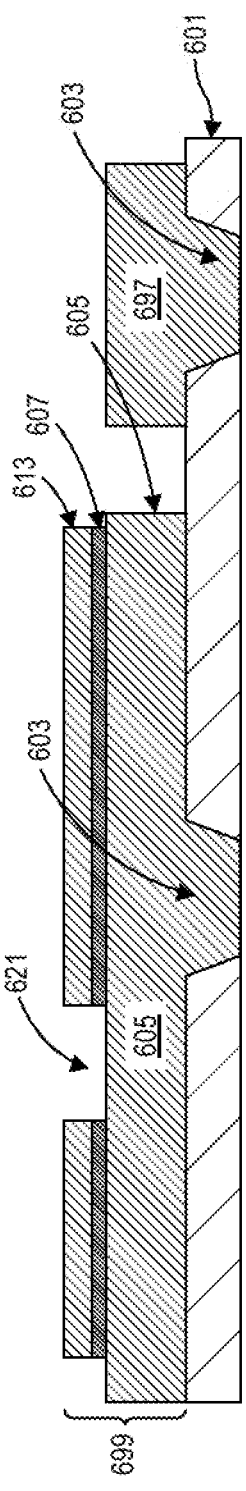
Figure 6G:
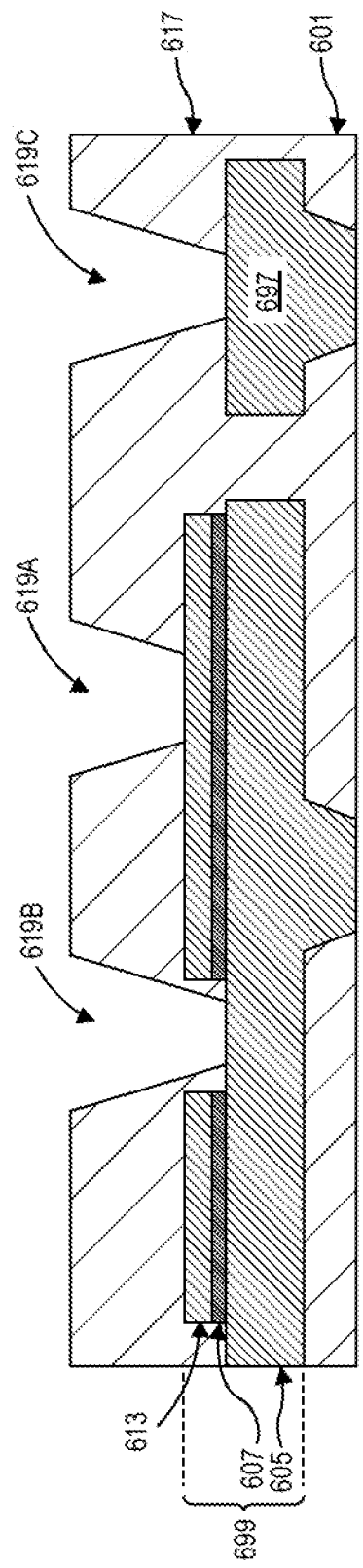

Referring now to FIG. 6E, a photoresist 615 is disposed on the top electrode layer 613 and patterned. The photoresist 615 may be developed using lithographic processes known in the art. Next, and as shown in FIG. 6F, the portions of the top electrode layer 613 and the capacitor dielectric layer 607 that are not under the photoresist 615 are etched away to form an in situ TFC 699. The in situ TFC 699 comprises the top electrode 613, the capacitor dielectric layer (which can be formed from a capacitor dielectric only or from a capacitor dielectric and one or more barrier layers) 607, and the bottom electrode 605. Next, the photoresist 615 is removed using suitable removal techniques known in the art. Following removal of the photoresist 615, and as shown in FIG. 6G, a build-up layer 617 is positioned (e.g., laminated, etc.) on exposed surfaces of the bottom electrode 605, the capacitor dielectric layer 607, the top electrode 613, the build-up layer 601, and the pad 697. Next, and as shown in FIG. 6G, a via opening 619A is formed on the top electrode layer 613, a via opening 619B is formed on the bottom electrode layer 605, and a via opening 619C is formed on the pad 697. Additional processing operations may be performed following formation of the via openings 619A-619C (e.g., filling the via openings 619A-619C) until a package substrate is formed.

Figure 7A:
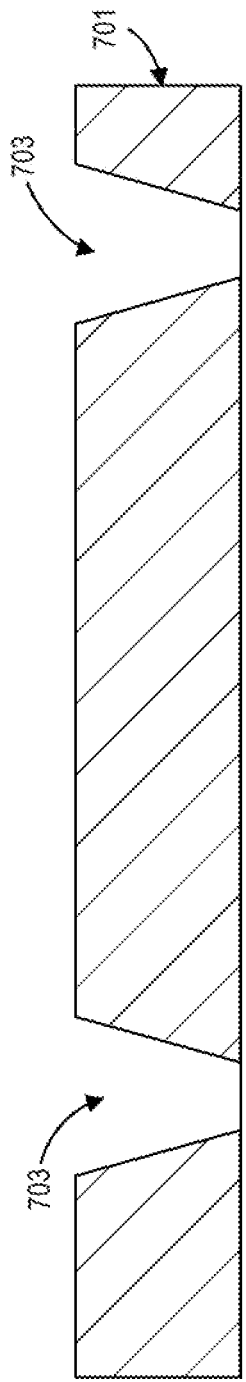
Figure 7B:
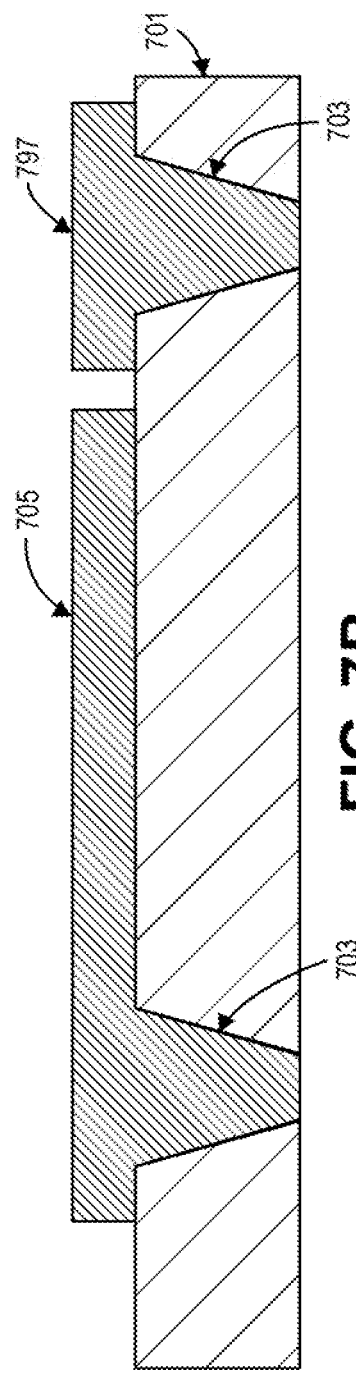
Figure 7C:
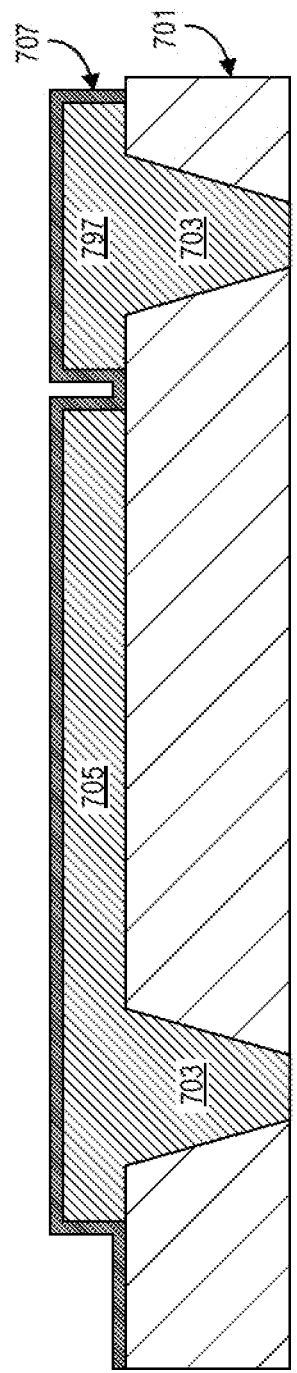

FIGS. 7A-7I are a cross-sectional side view illustration of a process of fabricating an in situ TFC 799 in an electronic package, according to another embodiment. With regard now to FIG. 7A, a build-up layer 701 with via openings 703 drilled therein is shown. Next, and as shown in FIG. 7B, a metallic material is deposited on the build-up layer 701 and processed to form a bottom electrode layer 705 and a pad 797 on the build-up layer 701. Also, the metallic material is deposited in the vias openings 703 to form vias 703. Following formation of the bottom electrode layer 705, the vias 703, and the pad 797, a capacitor dielectric layer 707 is deposited, as shown in FIG. 7C.

Figure 7D:
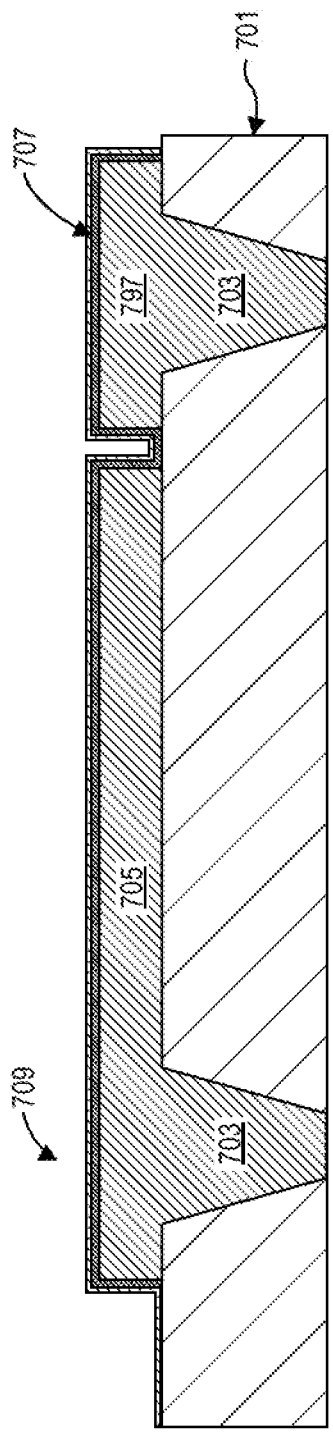

In FIG. 7D, a metallic material is deposited on exposed surfaces of the capacitor dielectric layer 707 and processed to form a top electrode layer 709. In one embodiment, the metallic material that is deposited on the capacitor dielectric layer 707 is deposited using two consecutive operations: (i) sputtering a thin film on the capacitor dielectric layer 707; and (ii) electroplating additional metallic material on the sputtered thin film. The consecutive operations result in a metal layer (e.g., a top electrode 709, etc.) over the capacitor dielectric layer 707 that is thick enough to act as a base for a via. In one embodiment, the consecutive operations result in a metal layer (e.g., a top electrode 709, etc.) over the capacitor dielectric layer 707 that has a desired ESR.

Figure 7E:
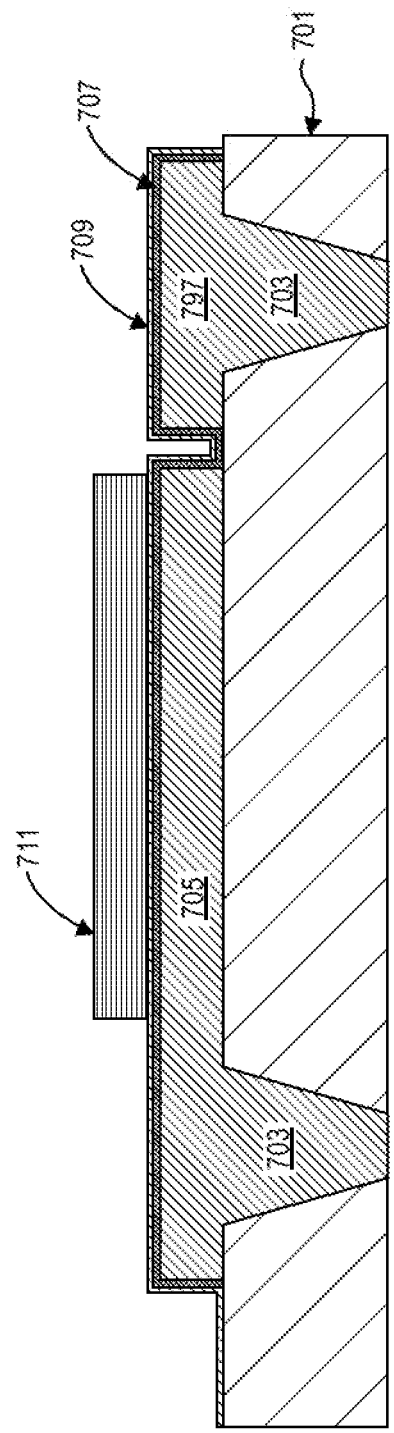
Figure 7F:
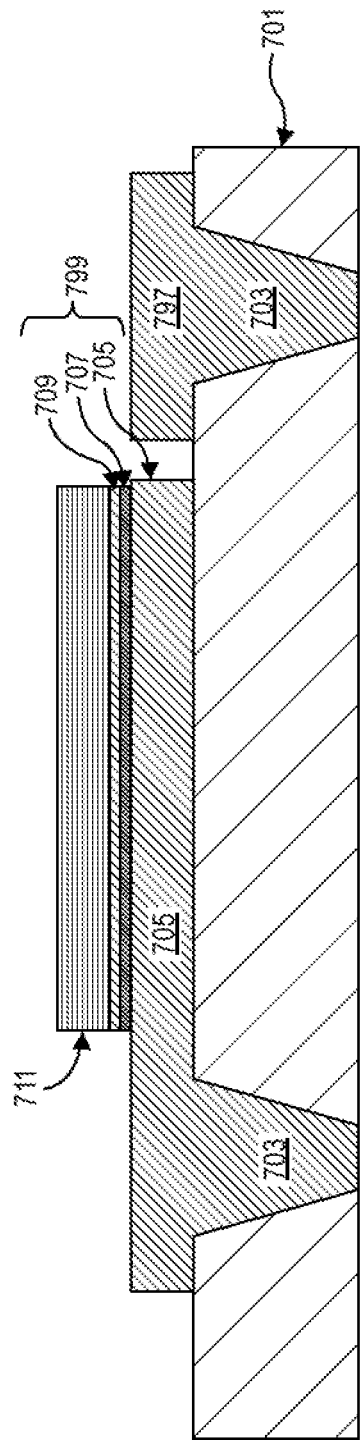

Moving on to FIG. 7E, a photoresist 711 is disposed on the top electrode layer 709. The photoresist 711 is developed using any lithographic technique or techniques known in the art. Next, and as shown in FIG. 7F, the portions of the top electrode layer 709 and the capacitor dielectric layer 707 that are not under the photoresist 711 are etched away to reveal a surface of the bottom electrode 705 and a surface of the pad 797. In this way, an in situ TFC 799 is formed. The in situ TFC 799 comprises the top electrode 709, the capacitor dielectric layer 707, and the bottom electrode 705.

Figure 7G:
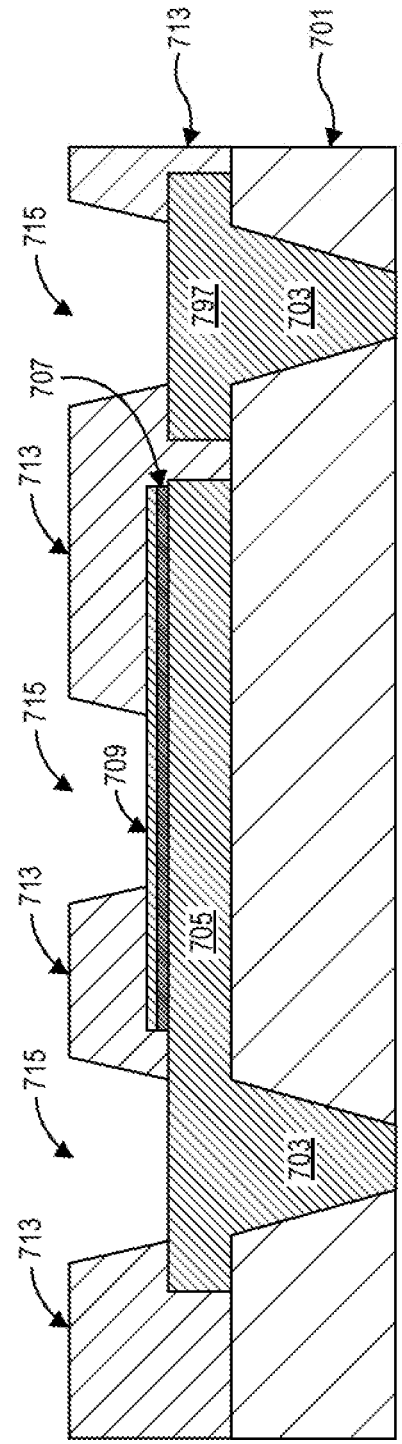

With regard now to FIG. 7G, the photoresist 711 is removed using any appropriate technique or techniques known in the art. Also, a solder resist layer 713 is laminated on exposed surfaces of the bottom electrode layer 705, the top electrode layer 709, the build-up layer 701, the capacitor dielectric layer 707, and the pad 797. Next, the solder resist layer 713 is processed to form openings 715 that expose a surface of the bottom electrode layer 705, a surface of the top electrode layer 709, and a surface of the pad 797. Moving on to FIG. 7H, a surface finish 717 is disposed in the openings 715 above the exposed surfaces of the bottom electrode layer 705, the top electrode layer 709, and the pad 797. At FIG. 7I, interconnects (e.g., bumps, pillars, etc.) 719 are formed on the surface finish 717.

Figure 8:
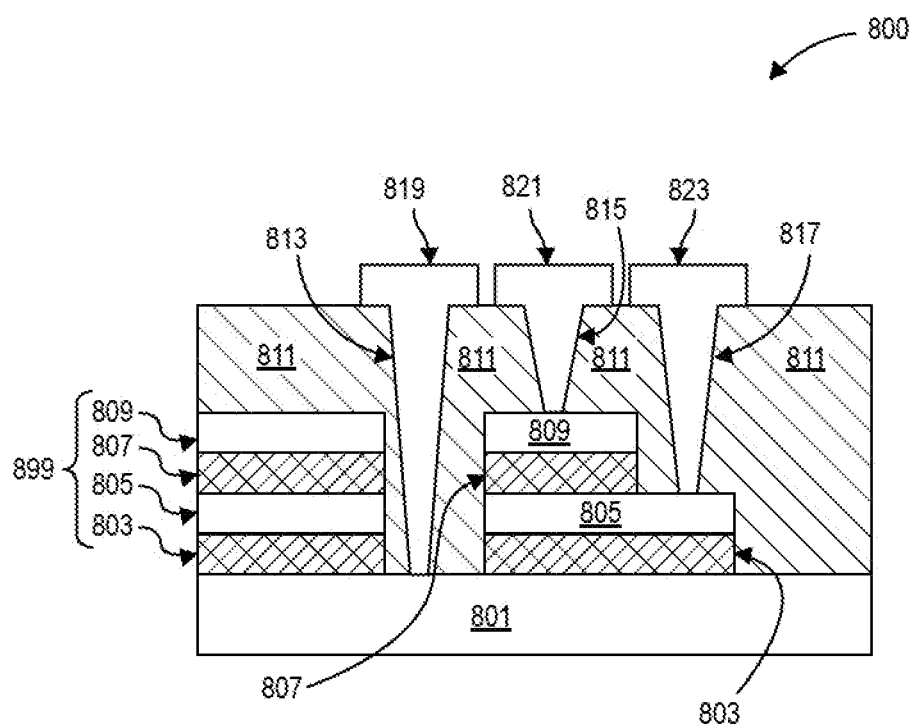
FIG. 8 is a cross-sectional side view illustration of an electronic package portion that includes a TFC, which comprises multiple dielectric layers stacked between multiple electrodes, according to one embodiment.

FIG. 8 is a cross-sectional side view illustration of an electronic package portion 800 that includes an in situ TFC 899, which comprises dielectric layers 803 and 807 and electrodes 801, 805, and 809, according to one embodiment. The portion 800 shown in FIG. 8 is similar to the portion 150 described above in connection with FIG. 1, with the exception that the in situ TFC 899 in FIG. 8 includes multiple dielectric layers 803 and 807 sandwiched between multiple electrodes 801, 805, and 809. This configuration shows that embodiments of an in situ TFC described herein can be modified to have any number of dielectric layers that are sandwiched between electrode layers. In this way, a desired or required decoupling capacitance area density from the in situ TFC can be obtained.

Figure 9:
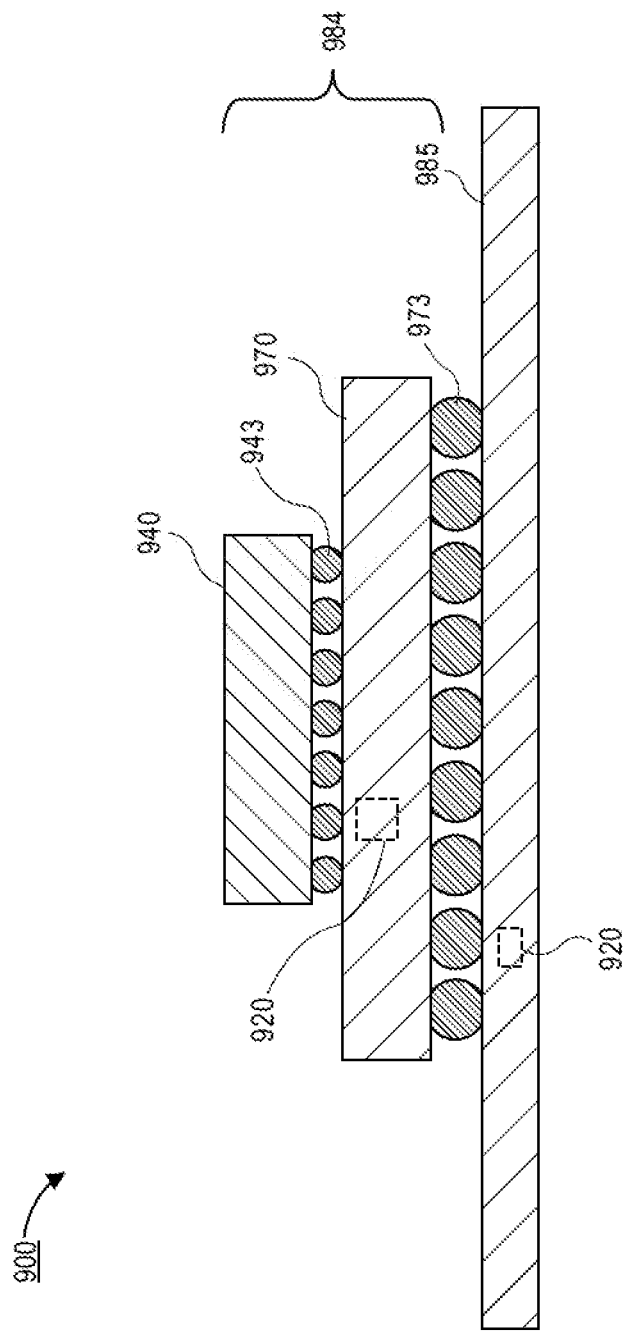
FIG. 9 is a cross-sectional side view illustration of a packaged system, according to one embodiment.

FIG. 9 is a cross-sectional side view illustration of a packaged system 900, according to one embodiment. In an embodiment, the packaged system 900 may include a semiconductor package 984. The package 984 comprises components that are similar to or the same as the components described above in connection with the package 100 shown in FIG. 1. In one embodiment, the package 984 includes a package substrate 970 that comprises one or more in situ TFCs (e.g., any one of the in situ TFCs described above in connection with FIGS. 1-8, etc.) 920. Furthermore, the package 984 may include a component (e.g., one or more dies, one or more die stacks, etc.) 940 positioned on the package substrate 970. The component 940 may be electrically coupled to the package substrate 970 using interconnects (e.g., bumps, pillars, etc.) 943.

In an embodiment, the packaged system 900 may include the semiconductor package 984 electrically coupled to a board 985 (e.g., a PCB, etc.) with interconnects (e.g., bumps, pillars, etc.) 973 and any other suitable interconnect architecture, such as wire bonding, ball grid array, pin grid array, land grid array, or the like. In one embodiment, the board 985 comprises one or more in situ TFCs (e.g., any one of the in situ TFCs described above in connection with FIGS. 1-8, etc.) 920.

Figure 10:
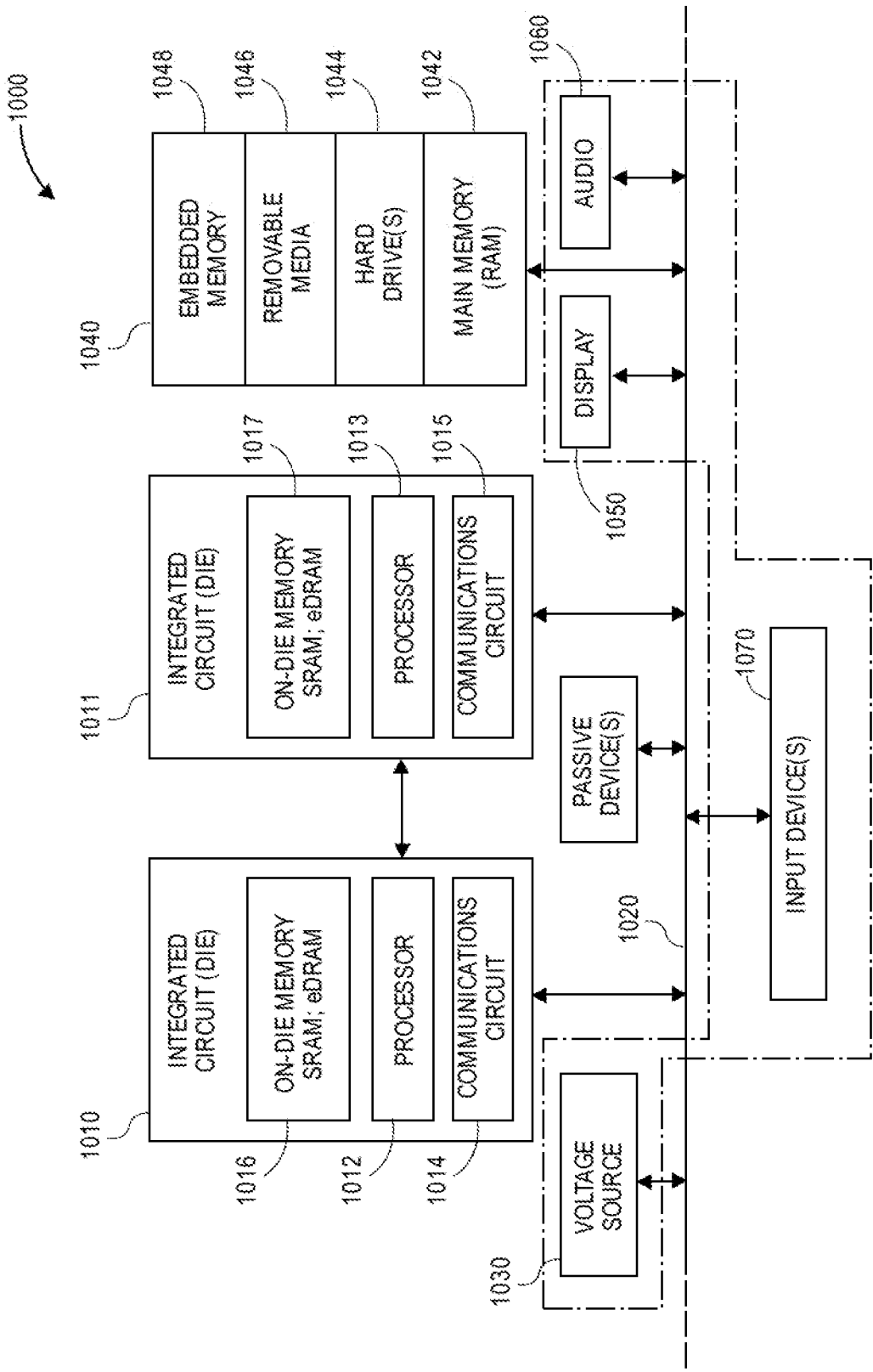
FIG. 10 is schematic illustration of a computer system, according to one embodiment.

FIG. 10 illustrates a schematic of computer system 1000 according to an embodiment. The computer system 1000 (also referred to as an electronic system 1000) can include a semiconductor package comprising one or more in situ TFCs formed therein in accord with any of the embodiments and their equivalents as set forth in this disclosure. The computer system 1000 may be a mobile device, a netbook computer, a wireless smart phone, a desktop computer, a hand-held reader, a server system, a supercomputer, or a high-performance computing system.

The system 1000 can be a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In one embodiment, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a semiconductor package comprising one or more in situ TFCs formed therein in accordance with any of the embodiments and their equivalents, as described in the foregoing specification. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM). In one embodiment, the on-die memory 1016 may be packaged with a process in accordance with any of the embodiments and their equivalents, as described in the foregoing specification.

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050 and an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

At least one of the integrated circuits 1010 or 1011 can be implemented in a number of different embodiments, including a semiconductor package comprising one or more in situ TFCs formed therein as described herein, an electronic system, a computer system, one or more methods of fabricating an integrated circuit, and one or more methods of fabricating a semiconductor package comprising one or more in situ TFCs formed therein, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising a stress absorption material in accordance with any of the disclosed embodiments as set forth herein and their art-recognized equivalents. A foundation substrate may be included, as represented by the dashed line of FIG. 10. Passive devices may also be included, as is also depicted in FIG. 10.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLPs), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Example Embodiment 1

An electronic package comprises: a thin film capacitor (TFC), a first vertical interconnect access (via) positioned on an exposed portion of a first electrode of the TFC; and a second via positioned on an exposed surface of the second electrode of the TFC. The TFC comprises the first electrode; a dielectric layer over the first electrode; and the second electrode over the dielectric layer. The dielectric layer comprises a first opening. The second electrode comprises a second opening positioned above the first opening. The first opening and the second opening expose a portion of the first electrode.

Example Embodiment 2

The electronic package of example embodiment 1, wherein the dielectric layer comprises a high-k dielectric.

Example Embodiment 3

The electronic package of example embodiment 2, further comprising one or more barrier metals, wherein the one or more barrier metals contact the high-k dielectric.

Example Embodiment 4

The electronic package of example embodiment 1, 2, or 3, wherein a solder resist is disposed along sidewalls of the first electrode.

Example Embodiment 5

The electronic package of example embodiment 1, 2, 3, or 4, wherein the first electrode is embedded in a build-up layer.

Example Embodiment 6

The electronic package of any one of example embodiments 1-5, wherein the first electrode is a lithographically defined via.

Example Embodiment 7

The electronic package of any one of example embodiments 1-6, wherein a thickness of the first electrode is greater than a thickness of the second electrode.

Example Embodiment 8

The electronic package of any one of example embodiments 1-7, further comprising: a second dielectric layer positioned on the second electrode; and a third electrode positioned on the second dielectric layer.

Example Embodiment 9

The electronic package of any one of example embodiments 1-8, wherein the TFC is embedded in a build-up layer of the electronic package.

Example Embodiment 10

The electronic package of any one of example embodiments 1-8, wherein the TFC is over a build-up layer of the electronic package.

Example Embodiment 11

The electronic package of any one of example embodiments 1-10, wherein the dielectric layer has a plurality of first openings and the second electrode has a plurality of second openings.

Example Embodiment 12

A semiconductor package comprises: one or more dies coupled to a package substrate comprising build-up layers interspaced with metal layers; and a thin film capacitor (TFC) positioned in the package substrate. The TFC comprises: a first electrode; a dielectric layer over the first electrode; and a second electrode over the dielectric layer. The dielectric layer comprises a first opening. The second electrode comprises a second opening positioned above the first opening. The first opening and the second opening expose a portion of the first electrode.

Example Embodiment 13

The semiconductor package of example embodiment 12, wherein the TFC is under the one or more dies.

Example Embodiment 14

The semiconductor package of any one of example embodiments 12-13, wherein a footprint of the TFC at least partially overlaps a footprint of the one or more dies.

Example Embodiment 15

The semiconductor package of any one of example embodiments 12-14, wherein the dielectric layer comprises a high-k dielectric.

Example Embodiment 16

The semiconductor package of example embodiment 15, further comprising two barrier layers, wherein the high-k dielectric is positioned between the two barrier layers.

Example Embodiment 17

The semiconductor package of any one of example embodiments 12-16, wherein a thickness of the first electrode is greater than a thickness of the second electrode.

Example Embodiment 18

The semiconductor package of any one of example embodiments 12-17, further comprising: a second dielectric layer positioned on the second electrode; and a third electrode positioned on the second dielectric layer.

Example Embodiment 19

The semiconductor package of any one of example embodiments 12-18, wherein the TFC is embedded in a build-up layer of the electronic package.

Example Embodiment 20

The semiconductor package of any one of example embodiments 12-18, wherein the TFC is over a build-up layer of the electronic package.

Example Embodiment 21

The semiconductor package of any one of example embodiments 12-20, wherein the dielectric layer has a plurality of first openings and the second electrode has a plurality of second openings.

Example Embodiment 22

An electronic package comprises: a thin film capacitor (TFC). The TFC comprises: a first electrode layer; a dielectric layer over the first electrode layer; and a second electrode layer over the dielectric layer. The dielectric layer comprises a plurality of first openings. The second electrode layer comprises a plurality of second openings. Each of the second openings is positioned above one of the first openings. Each combination of a first opening and a second opening expose a portion of the first electrode layer. One or both of the first electrode layer and the second electrode layer comprises a plurality of distinct electrodes.

Example Embodiment 23

The electronic package of example embodiment 22, wherein a ground shield is positioned between at least two of the distinct electrodes.

Example Embodiment 24

A method comprises: disposing a high-k dielectric on a first electrode on a layer of package substrate; plating a second electrode onto the high-k dielectric; disposing a photoresist layer on the second electrode; lithographically patterning the photoresist layer; etching exposed portions of the second electrode and portions of the high-k dielectric that are under the exposed portions of the second electrode; and removing the lithographically patterned photoresist layer.

Example Embodiment 25

The method of example embodiment 24, further comprising: forming a first vertical interconnect access (via) on a surface of the first electrode; and forming a second via on a surface of the second electrode.

The invention claimed is:

1. An electronic package, comprising:
a thin film capacitor (TFC), the TFC comprising:
a first electrode;
a dielectric layer over the first electrode, wherein the dielectric layer comprises a first portion and a second portion on the first electrode, wherein a first opening is between the first portion and the second portion, wherein the first opening exposes a portion of the first electrode, wherein the dielectric layer comprises a high-k dielectric, and the TFC further comprising one or more barrier metals, wherein the one or more barrier metals contact the high-k dielectric; and
a second electrode over the dielectric layer, wherein the second electrode comprises a second opening positioned above the first opening, and wherein the second opening exposes the first opening and exposes the portion of the first electrode;
a first via positioned on the exposed portion of the first electrode; and
a second via positioned on an exposed surface of the second electrode.

2. The electronic package of claim 1, wherein a solder resist is disposed along sidewalls of the first electrode.

3. The electronic package of claim 1, wherein the first electrode is embedded in a build-up layer.

4. The electronic package of claim 1, wherein the first electrode is a lithographically defined via.

5. The electronic package of claim 1, wherein a thickness of the first electrode is greater than a thickness of the second electrode.

6. The electronic package of claim 1, further comprising:
a second dielectric layer positioned on the second electrode; and
a third electrode positioned on the second dielectric layer.

7. The electronic package of claim 1, wherein the TFC is embedded in a build-up layer of the electronic package.

8. The electronic package of claim 1, wherein the TFC is over a build-up layer of the electronic package.

9. The electronic package of claim 1, wherein the dielectric layer has a plurality of first openings and the second electrode has a plurality of second openings.

10. A semiconductor package, comprising:
one or more dies coupled to a package substrate, the package substrate comprising build-up layers interspaced with metal layers; and
a thin film capacitor (TFC) positioned in the package substrate, the TFC comprising:
a first electrode;
a dielectric layer over the first electrode, wherein the dielectric layer comprises a first opening; and
a second electrode over the dielectric layer, wherein the second electrode comprises a second opening positioned above the first opening, and wherein the first opening and the second opening expose a portion of the first electrode.

11. The semiconductor package of claim 10, wherein the TFC is under the one or more dies.

12. The semiconductor package of claim 11, wherein a footprint of the TFC at least partially overlaps a footprint of the one or more dies.

13. The semiconductor package of claim 10, wherein the dielectric layer comprises a high-k dielectric.

14. The semiconductor package of claim 13, further comprising two barrier layers, wherein the high-k dielectric is positioned between the two barrier layers.

15. The semiconductor package of claim 10, wherein a thickness of the first electrode is greater than a thickness of the second electrode.

16. The semiconductor package of claim 10, further comprising:
a second dielectric layer positioned on the second electrode; and
a third electrode positioned on the second dielectric layer.

17. The semiconductor package of claim 10, wherein the TFC is embedded in a build-up layer of the electronic package.

18. The semiconductor package of claim 10, wherein the TFC is over a build-up layer of the electronic package.

19. The semiconductor package of claim 10, wherein the dielectric layer has a plurality of first openings and the second electrode has a plurality of second openings.

20. An electronic package, comprising:
a thin film capacitor (TFC), wherein the TFC comprises:
a first electrode layer;
a dielectric layer over the first electrode layer, wherein the dielectric layer comprises a plurality of first openings; and
a second electrode layer over the dielectric layer, wherein the second electrode layer comprises a plurality of second openings, wherein each of the second openings is positioned above one of the first openings, and wherein each combination of a first opening and a second opening expose a portion of the first electrode layer,
wherein one or both of the first electrode layer and the second electrode layer comprises a plurality of distinct electrodes.

21. The electronic package of claim 20, wherein a ground shield is positioned between at least two of the distinct electrodes.

22. An electronic package, comprising:
a thin film capacitor (TFC), the TFC comprising:
a first electrode, wherein the first electrode is a lithographically defined via;
a dielectric layer over the first electrode, wherein the dielectric layer comprises a first opening; and
a second electrode over the dielectric layer, wherein the second electrode comprises a second opening positioned above the first opening, and wherein the first opening and the second opening expose a portion of the first electrode;
a first via positioned on the exposed portion of the first electrode; and
a second via positioned on an exposed surface of the second electrode.

23. An electronic package, comprising:
a thin film capacitor (TFC), the TFC comprising:
a first electrode;
a dielectric layer over the first electrode, wherein the dielectric layer comprises a plurality of first openings; and a second electrode over the dielectric layer, wherein the second electrode comprises a plurality of second openings positioned above the plurality of first openings, and wherein the plurality of first openings and the plurality of second openings expose a portion of the first electrode;

a first via positioned on the exposed portion of the first electrode; and a second via positioned on an exposed surface of the second electrode.

24. An electronic package, comprising:
a thin film capacitor (TFC), the TFC comprising:
   a first electrode;
   a dielectric layer over the first electrode, wherein the dielectric layer comprises a first portion and a second portion on the first electrode, wherein a first opening is between the first portion and the second portion, and wherein the first opening exposes a portion of the first electrode; and
   a second electrode over the dielectric layer, wherein the second electrode comprises a second opening positioned above the first opening, and wherein the second opening exposes the first opening and exposes the portion of the first electrode;
a first via positioned on the exposed portion of the first electrode;
a second via positioned on an exposed surface of the second electrode; and
a solder resist is disposed along sidewalls of the first electrode.

25. An electronic package, comprising:
a thin film capacitor (TFC), the TFC comprising:
   a first electrode, wherein the first electrode is embedded in a build-up layer;
   a dielectric layer over the first electrode, wherein the dielectric layer comprises a first portion and a second portion on the first electrode, wherein a first opening is between the first portion and the second portion, and wherein the first opening exposes a portion of the first electrode; and
   a second electrode over the dielectric layer, wherein the second electrode comprises a second opening positioned above the first opening, and wherein the second opening exposes the first opening and exposes the portion of the first electrode;
a first via positioned on the exposed portion of the first electrode; and
a second via positioned on an exposed surface of the second electrode.

26. An electronic package, comprising:
a thin film capacitor (TFC), the TFC comprising:
   a first electrode;
   a dielectric layer over the first electrode, wherein the dielectric layer comprises a first portion and a second portion on the first electrode, wherein a first opening is between the first portion and the second portion, and wherein the first opening exposes a portion of the first electrode; and
   a second electrode over the dielectric layer, wherein the second electrode comprises a second opening positioned above the first opening, and wherein the second opening exposes the first opening and exposes the portion of the first electrode, wherein a thickness of the first electrode is greater than a thickness of the second electrode;
a first via positioned on the exposed portion of the first electrode; and
a second via positioned on an exposed surface of the second electrode.

27. An electronic package, comprising:
a thin film capacitor (TFC), wherein the TFC is embedded in a build-up layer of the electronic package, the TFC comprising:
   a first electrode;
   a dielectric layer over the first electrode, wherein the dielectric layer comprises a first portion and a second portion on the first electrode, wherein a first opening is between the first portion and the second portion, and wherein the first opening exposes a portion of the first electrode; and
   a second electrode over the dielectric layer, wherein the second electrode comprises a second opening positioned above the first opening, and wherein the second opening exposes the first opening and exposes the portion of the first electrode;
a first via positioned on the exposed portion of the first electrode; and
a second via positioned on an exposed surface of the second electrode.

28. An electronic package, comprising:
a thin film capacitor (TFC), wherein the TFC is over a build-up layer of the electronic package, the TFC comprising:
   a first electrode;
   a dielectric layer over the first electrode, wherein the dielectric layer comprises a first portion and a second portion on the first electrode, wherein a first opening is between the first portion and the second portion, and wherein the first opening exposes a portion of the first electrode; and
   a second electrode over the dielectric layer, wherein the second electrode comprises a second opening positioned above the first opening, and wherein the second opening exposes the first opening and exposes the portion of the first electrode;
a first via positioned on the exposed portion of the first electrode; and
a second via positioned on an exposed surface of the second electrode.

* * * * *